United States Patent
Elsherbini et al.

(10) Patent No.: US 12,199,012 B2
(45) Date of Patent: Jan. 14, 2025

(54) MODULAR MICROCHANNEL THERMAL SOLUTIONS FOR INTEGRATED CIRCUIT DEVICES

(71) Applicant: Intel Corporation, Santa Clara, CA (US)

(72) Inventors: Adel Elsherbini, Tempe, AZ (US); Stephen Morein, Chandler, AZ (US); Feras Eid, Chandler, AZ (US); Georgios Dogiamis, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1013 days.

(21) Appl. No.: 16/914,066

(22) Filed: Jun. 26, 2020

(65) Prior Publication Data

US 2021/0407888 A1   Dec. 30, 2021

(51) Int. Cl.
| | |
|---|---|
| *H01L 23/467* | (2006.01) |
| *C23C 24/04* | (2006.01) |
| *H01L 21/48* | (2006.01) |
| *H01L 23/373* | (2006.01) |
| *H01L 23/473* | (2006.01) |
| *F28D 1/03* | (2006.01) |
| *F28D 21/00* | (2006.01) |

(52) U.S. Cl.
CPC ............ *H01L 23/467* (2013.01); *C23C 24/04* (2013.01); *H01L 21/4882* (2013.01); *H01L 23/473* (2013.01); *F28D 1/0316* (2013.01); *F28D 2021/0029* (2013.01); *F28F 2260/02* (2013.01); *H01L 23/3731* (2013.01); *H01L 23/3736* (2013.01); *H01L 23/3738* (2013.01)

(58) Field of Classification Search
CPC ............ H01L 21/4882; H01L 23/373; H01L 23/3731; H01L 23/3736; H01L 23/46; H01L 23/467; H01L 23/473; F28D 1/03; F28D 1/0308; F28D 1/0316; F28D 2021/0029; F28F 2260/02
See application file for complete search history.

(56) References Cited

U.S. PATENT DOCUMENTS

| | | | | |
|---|---|---|---|---|
| 2004/0262743 | A1* | 12/2004 | Houle ................. | H01L 23/3736 257/722 |
| 2005/0285261 | A1* | 12/2005 | Prasher ................ | H01L 23/427 257/E23.098 |
| 2007/0124934 | A1* | 6/2007 | Peng .................... | F28F 13/003 257/E23.098 |
| 2008/0179736 | A1* | 7/2008 | Hartwell .............. | H01L 23/473 257/E23.098 |
| 2010/0290188 | A1* | 11/2010 | Brunschwiler ..... | H01L 25/0657 361/699 |

(Continued)

*Primary Examiner* — Herve-Louis Y Assouman
*Assistant Examiner* — Christopher M Roland
(74) *Attorney, Agent, or Firm* — Essential Patents Group, LLP

(57) ABSTRACT

A microfluidic device having a channel within a first material to thermally couple with an IC die. The channel defines an initial fluid path between a fluid inlet port and a fluid outlet port. A second material is within a portion of the channel. The second material supplements the first material to modify the initial fluid path into a final fluid path between the fluid inlet port and the fluid outlet port. The second material may have a different composition and/or microstructure than the first material.

19 Claims, 14 Drawing Sheets

(56) References Cited

U.S. PATENT DOCUMENTS

| | | | |
|---|---|---|---|
| 2015/0091156 A1* | 4/2015 | Kim | H01L 23/4275 |
| | | | 257/713 |
| 2017/0092565 A1* | 3/2017 | Chen | H05K 7/20281 |
| 2019/0154362 A1* | 5/2019 | Katayama | B32B 9/04 |
| 2019/0162484 A1* | 5/2019 | Schlottig | H01L 23/3733 |
| 2019/0385925 A1* | 12/2019 | Walczyk | H01L 23/3677 |
| 2020/0187385 A1* | 6/2020 | Olesen | H01L 23/473 |
| 2021/0098335 A1* | 4/2021 | Yu | H01L 23/3677 |
| 2023/0207426 A1* | 6/2023 | Yaglioglu | H05K 7/20281 |
| | | | 257/714 |

* cited by examiner

MODULAR MICROCHANNEL THERMAL SOLUTIONS FOR INTEGRATED CIRCUIT DEVICES

BACKGROUND

Semiconductor packages containing thin dies (e.g., 150 microns thick or less), stacked dies, or dies with high power devices may have particular challenges in mitigating local hotspots and/or keeping the die(s) below certain temperature threshold under certain operating conditions. The resulting high die temperatures may manifest as transient and steady-state mode problems. As an example, temperature spikes due to localized hot spot formation may force a processor chip to temporarily reduce the processor speed in order to reduce the power consumption during a high-performance calculation. Maximum steady-state operating temperature of the processor may require throttling and performance reduction. Microfluidic channels have been integrated into a variety of thermal solutions to enhance cooling capability. Currently, optimization of microfluidic cooling devices, requires an original design and fabrication specific for a particular integrated circuit chip. Changes in integrated circuitry layouts or power ratings will then require a redesign and re-fabrication of the associated microfluidic cooling devices, adding to manufacturing complexity and device cost.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
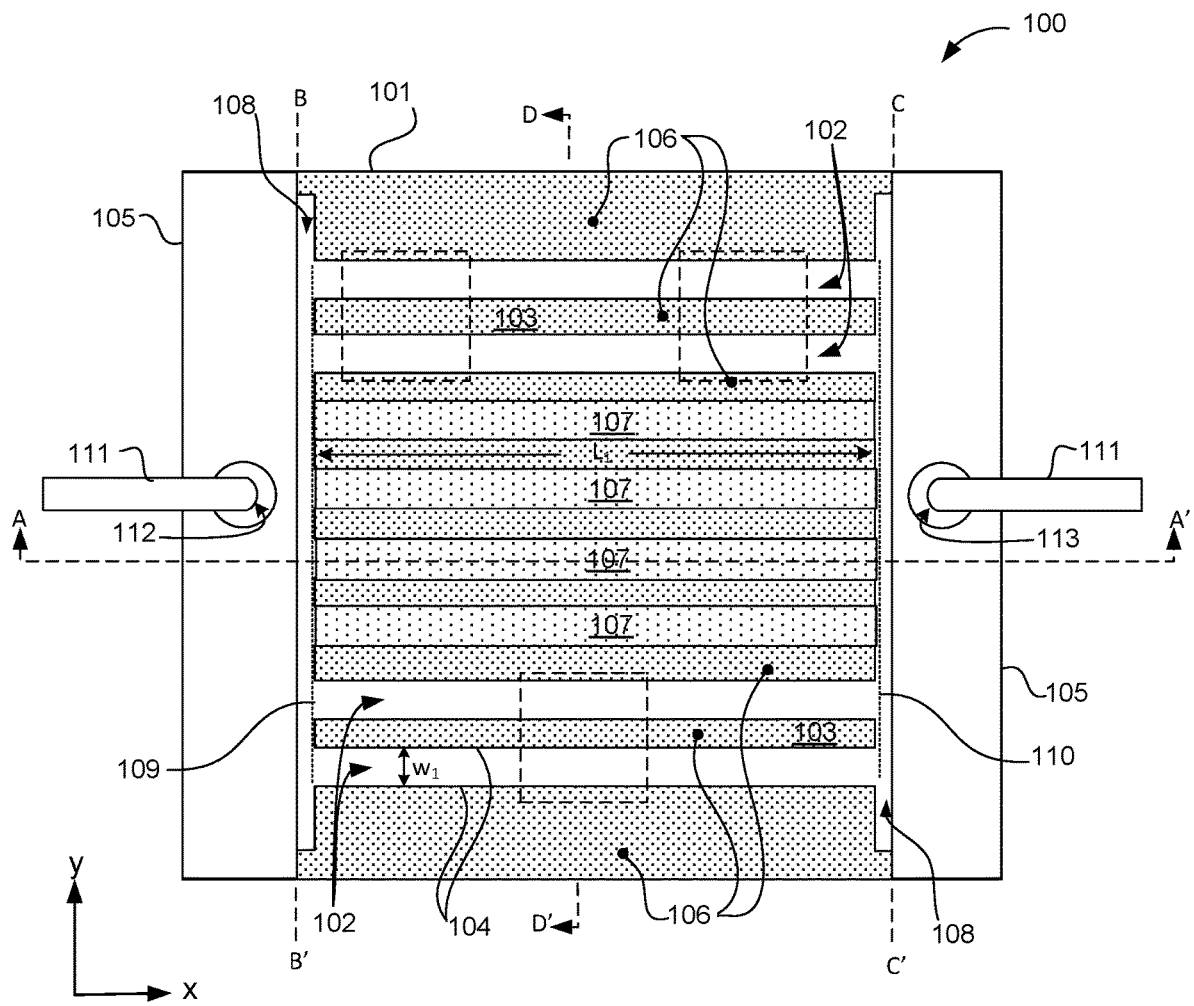
FIG. 1A illustrates a plan cut-away view in the x-y plane of customizable microfluidic device, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

Here, the term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

Here, the term "hotspot" generally refers to areas of a high-performance IC device that heat excessively due to high power demands of circuitry located in the hotspot region.

Here, the term "microfluidic" devices generally refers to devices comprising sub-millimeter wide channels (e.g., microchannels, microducts or microconduits) to convey small amounts (e.g., microliters) of fluid flows on compact carrier substrates such as silicon or glass/ceramic or metal. Microfluidic features such as microchannels are generally integrated into the carrier substrate.

Here, the term "thermal solution" generally refers to an integrated IC package component that is assembled over one or more IC chips and thermally coupled thereto. Its function is to mitigate temperature non-uniformities across the IC chip and/or to facilitate heat transfer out of the package. An integrated heat spreader is one example of a thermal solution, which may be of a metal having a high thermal conductivity, such as copper, steel or aluminum. A heat sink and heat exchanger are two other examples of a thermal solution.

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is a package-level microfluidic cooling device (e.g. an integrated heat spreader, a heat exchanger, etc.) comprising microfluidic channels defined, in part, by a customizable, or configurable, template structure and further defined, in part, by a supplemental material deposited by a high-throughput additive manufacturing (HTAM) process. Here, the terms "customizable" or "configurable," which may be used interchangeably, generally refer to the ability to receive a supplemental material that alters generic preliminary microfluidic features in the substrate material into microchannel routing, etc. specific customized to a particular application. Customization of microfluidic routing may be done according to the physical location of hotspots on an IC device, for example. The terms "customized" and "configured" generally refer to a microfluidic structure that includes both template material and supplemental material that together define a final fluid pathway through the microfluidic device.

The template substrate may be a planar structure, such as a rectangular metal sheet or preform. In some embodiments, the template substrate comprises microfluidic features that may be have been formed in the substrate material by a molding, stamping, etching or mechanical machining process, for example. Template substrates having generic layouts of microfluidic features such as microchannels may be reproduced by the hundreds or thousands and stocked for later production of customized microfluidic thermal solutions that are optimized for specific high-performance IC devices or for specific loads of such IC devices.

The microchannels of template substrates may be customized by deposition of a supplemental material into one or more microchannels. The supplemental material may be deposited to form plugs, flow restrictors or baffles to modify microfluidic flow patterns of a coolant fluid across the IC device when contacted with the thermal solution in a package assembly. The supplemental material may have a different composition and/or microstructure than the substrate material.

The generic templates may be stocked for later customization on an on-demand basis (e.g., in parallel to packaging of specific high-performance IC chips). A catalog of customizable generic microfluidic features may be created in anticipation of new generations and/or families of IC devices, or to retrofit current or older devices. Templates carrying pre-formed microchannels may be rapidly customized for optimal thermal management of specific high-performance IC devices by a high-throughput additive manufacturing (HTAM) deposition process. Structures such as plugs may be rapidly formed within microchannels by HTAM cold spray deposition of a powder or multiple powders that coalesce into the supplemental material. The HTAM cold spray process may define custom fluid flow paths having any desired pattern. Supplemental material may be deposited through a shadow mask or by one or more stationary or mobile spray nozzles over the template substrate.

By employment of a HTAM process such as cold spraying, microfluidic thermal solutions may be produced with optimized microchannel dimensions and shapes. Microfluidic thermal solutions may be custom manufactured on an on demand basis in accordance with the thermal management requirements of any high performance IC device, including microprocessors, graphical processing units, field-programmable gate array devices, etc. For example, individual microchannels on a microfluidic thermal solution may be supplemented to service specific regions of a microprocessor IC where a hot spot is likely to develop during high demand bursts. A customizable template structure may be configured to have coolant flow only in individual microchannels that traverse the parts of the IC device where hot spots are likely to develop. Other microchannels may be blocked with supplemental HTAM plugs so that more coolant flows over hot spots than over thermally stable portions of the IC device.

A common preform template substrate may accommodate a large number of customized microchannel patterns tailored to a variety of high performance IC devices and families of IC devices. Preformed template substrates may be manufactured and stocked in large quantities well in advance of anticipated device production. Production of custom thermal solutions having any microchannel configuration selected from a catalog of multiple configurations of custom microchannels may be made on a single or relatively few template models on an ondemand basis. The custom manufacture of thermal solutions tailored for specific IC devices may coincide with the timing and size of batch productions of the specific IC devices. IC packaging manufacturing flexibility and efficiency may be significantly increased and costs reduced by on-demand HTAM production of tailored package components such as microfluidic thermal solutions.

In some embodiments, the supplemental material has a composition similar to, or substantially the same as, the template substrate material. Where compositional similarities exist between template and supplemental materials (e.g., both template substrate and supplemental materials are copper), there may be differences in bulk and/or surface microstructure between the two materials. As an example, the porosity that may be expressed as % voiding area (as measured from a cross sectional micrograph) may be substantially greater in the supplemental material than in the template material. In some embodiments, voiding may be substantially absent in the surface and/or bulk of the template material. In some embodiments, the supplemental material may comprise compacted hybrid particles associated with a cold spraying process, where multiple lamellar domains are built up by particle compaction. In some embodiments, the hybrid structure comprises embedded particles and small lamellar domains of deformed particles ranging in size between 1 and 50 microns, comprising stacks of compressed and distended particles. As a result, the supplemental material may have voids that may be 0.1% to 0.5% of the cross-sectional area (e.g., as measured by scanning electron microscopy). The existence of voids, particularly within the supplemental material bulk, is indicative of the supplemental material features having been formed by a HTAM process, such as spray deposition (e.g., a cold spray process). Voiding area is generally a well-characterized quality control parameter that can be monitored in spray deposition processes. Hence, a non-zero voiding within supplemental features coupled with template material having a much lower voiding area (e.g., substantially zero) is indicative of customized microfluidic coolant fluid paths in accordance with some embodiments herein. As a further indication of HTAM-produced custom features, the surface roughness of the supplemental material may be substantially greater than that of the template material.

In some embodiments, a supplemental material has a composition that is substantially different from that of a template substrate. As an example, the template substrate may comprise bulk copper (e.g., having substantially zero voiding). The supplemental material may comprise a composite of copper and another material, such as diamond.

The template material and the supplemental material may have a high thermal conductivity (e.g., having thermal conductivities κ>100 W/m-K). The supplemental material may have a κ values substantially the same or higher than the template substrate. The thermal properties of each material may be such that the high thermal conductivity HTAM features are integral heat transfer structures, enabling the transfer of heat generated by an underlying IC chip with which the microfluidic thermal solution is in contact.

Several manufacturing processes may be employed to produce the template substrate. Template features may be formed by a molding process, creating the template from the substrate material, or by HTAM processes such as thermal or cold powder spraying or 3D printing of the substrate material. Optionally, template features may be formed by a subtractive manufacturing process such as etching or mechanical machining of a substrate blank. The materials may also be annealed at higher temperatures post deposition in order to improve their mechanical or thermal properties. In particular, a HTAM process is suited to producing a relatively large number of different microfluidic thermal solutions using a single template as a base substrate.

The supplemental material may be deposited within portions of one or more of the template microchannels, partially or fully occluding the microchannel to restrict or completely block fluid flow within selected template microchannels. The pattern of supplemental material deposition may be in accordance with map of hot spots of a particular IC die that is to be thermally coupled to the finished microfluidic thermal solution. For example, channels traversing hot spots of an underlying IC chip or multiple IC devices may remain unblocked, while microchannels traversing lower power regions of the IC chip(s) where hot spots do not occur are blocked or at least restricted with plugs of the supplemental material formed within the template microchannels.

In some embodiments, template features may include multiple parallel straight microchannels formed as elongated recesses having rectangular or round cross section within the substrate material, extending across a central portion of the substrate. Template features may further include two plena. Each plenum may be formed on opposite sides of the substrate. As used herein, the term "plenum" and "plena" (plural) generally refers to an antechamber(s) or cavity(ies) that distribute or collect fluids to or from one or more ducts or conduits that are coupled to the plenum or plena. In this disclosure, a plenum is a microfluidic structure, generally a main channel of a manifold. The microchannels may extend across a central portion of the substrate, where the plena may intersect the ends of the microchannels, forming manifolds into which the microchannels open. The two manifolds may be included in fluid inlet and outlet ports of a finished microfluidic device, where the inlet manifold is a distribution manifold and the outlet manifold is a collection manifold.

Thus coolant introduced into the fluid inlet may flow only over any hot spots of a particular IC die. Convective heat transfer from the hot spot(s) by the flowing coolant may remove greater amounts of heat from the hot spot than would otherwise be possible by conduction through solid material alone. Solid plugs comprising the supplemental material may form blockages or restrictions within microchannels traversing the thermally stable regions of the underlying IC die (or multiple IC chips in a MCP).

In some embodiments, multiple baffles comprising short segments of supplemental material may extend from sidewalls part way into template microchannels to restrict, but not completely block, flow within a microchannel. The multiple baffles may extend from opposing sidewalls in an alternating manner along portions of template microchannels over hot spots of an underlying IC die. The baffles may divert coolant streamlines from purely axial flow to include transverse flow components, producing turbulent mixing and other non-laminar coolant flow patterns over the hot spot region. The increased mixing may locally reduce the thickness of fluid flow boundary layer, enhancing convective heat transfer.

In some embodiments, the microfluidic thermal solution comprises microchannels defined by spaces between multiple parallel lines comprising a supplemental material deposited to a particular z-height over the template substrate. Microchannel bottoms may comprise substrate material, whereas sidewalls may comprise the supplemental material. The multiple parallel microchannels may extend across the substrate along straight lines or along non-linear paths from an inlet port to an outlet port. Inlet and outlet ports may also be similarly formed.

In some embodiments, the template substrate may be a planar blank coupon of substrate material, having no native structural features. Structural features comprising a supplemental material may be formed on the substrate to create microchannels in downstream manufacturing processes. As an example, ridges of supplemental material may be along the periphery of the substrate, framing an inner recessed region. The inner recessed region may have a rectangular form factor. Multiple parallel lines of supplemental material may extend laterally across a central portion of the recessed region, defining microchannels within spaces separating adjacent lines. The microchannels may extend along linear or non-linear paths between manifolds at opposing sides of the inner recessed region.

In some embodiments, a preformed template substrate comprises a two-dimensional array of pillars having cross sections that include cylindrical, rectangular, square, triangular or any other suitable polygonal shapes. Intersecting orthogonal microchannel segments may be formed by depositing supplemental material between adjacent template pillars. Microchannels comprising row and column segments may comprise walls formed of adjacent pillars comprising the substrate material. Gaps between adjacent pillars may be filled in by plugs comprising the supplemental material, sealing spaces between the adjacent pillars to form continuous microchannel sidewalls. Linear and/or non-linear microchannels may define one- or two-dimensional flow paths mapped to multiple hot spots within an IC die underlying the microfluidic device. Dedicated microchannels for each hot spot may be defined for the particular IC chip, where individual microchannels may direct a stream of fresh coolant to each hot spot. Heat transfer efficiency may be increased by reducing or eliminating sharing of coolant by multiple hot spots, also reducing pumping requirements and overall system costs.

At package level, the disclosed microfluidic thermal solutions may be part of a thermal management stack comprising a thermal interface material (TIM) layer between the IC chip and the microfluidic device. In some embodiments, the TIM is a layer of a thermal grease or paste having a thickness of 50 to 1000 microns between an IC chip and a microfluidic thermal solution, such as a heat sink or cold plate coupled to a heat pipe or vapor chamber. In other embodiments, the TIM layer may be formed of metal or metal alloys such as indium, indium-silver, tin etc.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a plan cut-away view in the x-y plane of customizable microfluidic device 100, according to some embodiments of the disclosure.

Microfluidic device 100 (henceforth referred to as "device 100") comprises microchannel template substrate 101 (henceforth referred to as template substrate 101), further comprising multiple microchannels 102 separated by ridges 103. Microchannels 102 are lined by sidewalls 104 on vertical (z-direction) faces of ridges 103. Sidewalls 104 may be substantially vertical or sloped. A lid 105 (shown in cut-away along planes B-B' and C-C') is over template substrate 101 and bonded to surfaces 106 over ridges 103 and peripheral areas of template substrate 101 to form a hermetic seal around microchannels 102. In some embodiments, template substrate 101 and lid 105 comprise substantially malleable and/or ductile materials such as, but not limited to, copper, aluminum, iron, silver, gold, nickel, titanium, vanadium, and indium and alloys comprising any of the afore-mentioned metals and other metals not listed here. Additional materials may include brittle materials, such as, but not limited to, silicon carbide, aluminum nitride, boron nitride, tungsten and diamond. As an example, template substrate may comprise a composite material comprising copper-diamond or copper-aluminum composite.

Template substrate 101 and lid 105 may have lateral dimensions ranging from less than one millimeter to more than 100 millimeters on a side. Lid 105 may generally be the upper portion (in the z-direction) of heat spreader 100, and has similar lateral dimensions as template substrate 101 (or may be slightly larger or smaller, including a lip and alignment features) and a suitable thickness that may range from 100 to 500 microns. In implementations of device 100, template substrate 101 is in thermal contact with an IC device below template substrate 101 (not shown). Microchannels 102 may be formed in template substrate 101 by any number of suitable processes, including molding planar pieces having microchannel features (e.g., by injection molding). Additional methods may include stamping, etching and mechanical machining of a blank substrate coupon. The afore-mentioned manufacturing processes are primarily subtractive, involving removal of substrate material to form microchannels 102. In alternate embodiments, microchannels 102 may be formed instead by additive processes (e.g., an HTAM process). Microchannels 102 may have widths $w_1$ between channel sidewalls 104, ranging between 100 microns to several millimeters, for example. Both approaches may also be combined to allow channels that are preformed and channels that are additively manufactured.

In the illustrated embodiment, some microchannels 102 are backfilled with a supplemental material (e.g., a material formed by a HTAM process that differs in composition and/or microstructure from the substrate material), forming plugs 107 (shown as the cross-hatched regions). Plugs 107 may be deposited to into open microchannels 102 to completely occlude the channels. In the illustrated embodiment, plugs 107 span the full width $w_1$ of microchannels 102. Plugs 107 may have any length up to length $L_1$ of microchannels 102, which will advantageously leverage the thermal conductivity of the supplemental material within regions where fluid will not be conveyed. Hence, customization of a template microchannel pathways need not introduce any dead zones within a microfluidic device. In addition to plugs, flow restrictions and baffles (not shown) that do not completely block an template fluid pathway may be formed within microchannels 102.

Figure 7:
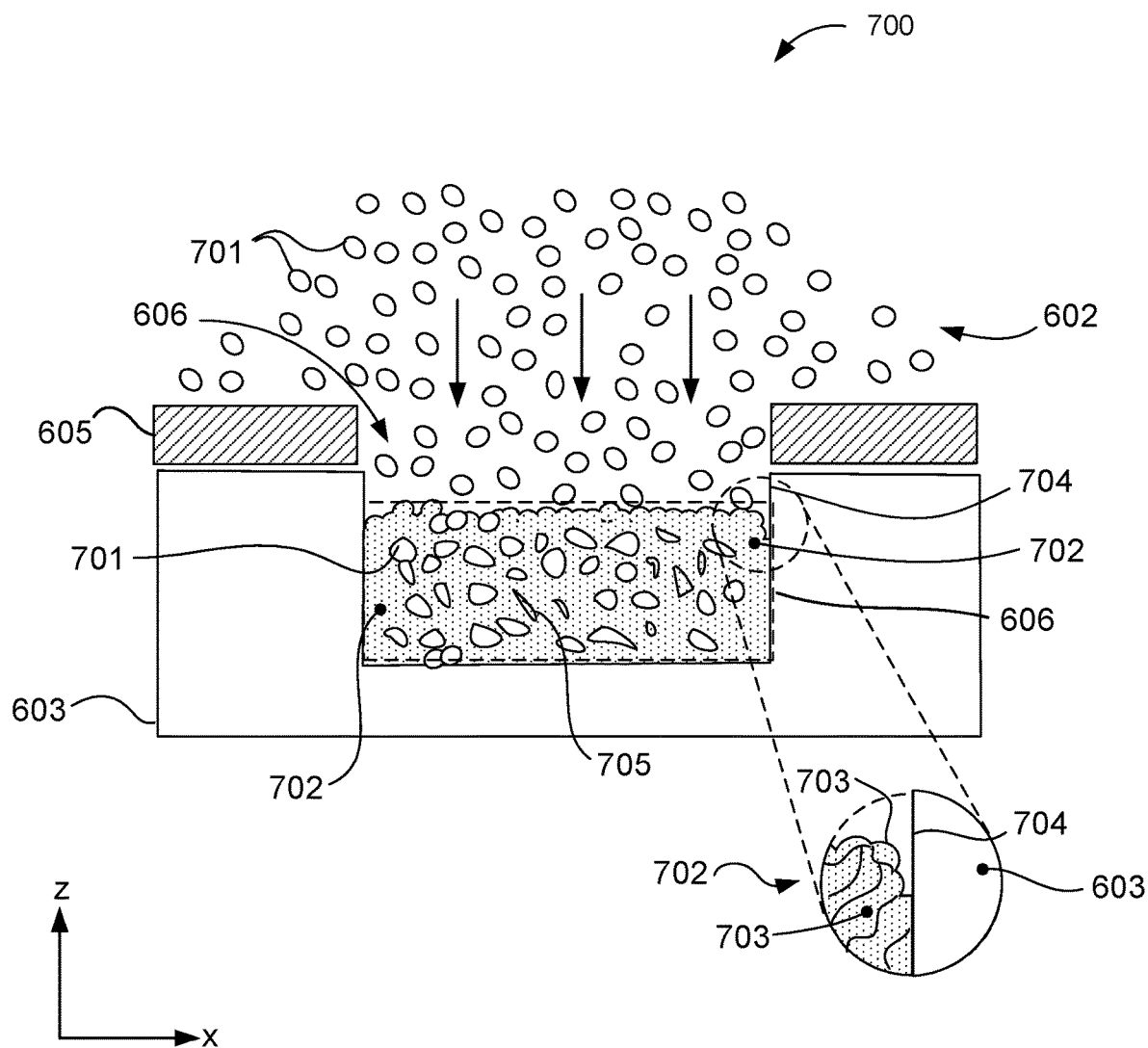
FIG. 7 illustrates a zoom view of the cold spray process shown in FIG. 6A, depicting details of the cold spray deposition of supplemental material into a microchannel to form a HTAM structure on a template substrate, according to some embodiments of the disclosure.

Plugs 107 and other structures may be formed by a HTAM process such as a cold spray process, whereby any suitable powder is spray deposited on template substrate 101. Plugs 107 may be formed by backfilling microchannels 102 with supplemental material. A HTAM process such as a cold spray process may be employed to backfill microchannels 102 with supplemental material. The supplemental material may comprise malleable and/or ductile materials such as, but not limited to, copper, aluminum, iron, nickel, and other metals that have been noted above. In some embodiments, the supplemental material has a composition that is substantially the same as template substrate 101. As an example, both template substrate 101 and the supplemental material comprise 99% copper. In some embodiments, while the supplemental material may also comprise substantially the same purity of copper as the substrate material, the supplemental material may exhibit a substantially different microstructure than that of template substrate, as shown in FIG. 7. In other embodiments, the composition of the supplemental material differs substantially from the composition of template substrate 101. As an example, template substrate 101 may comprise 95% or higher stainless steel, whereas the supplemental material may comprise over 99% copper.

In some embodiments, the supplemental material comprises a metal/non-metal composite, where the non-metal is a brittle material as described above. An example of such a composite is a copper-diamond composite.

Cold spraying is a HTAM process whereby materials are formed by impacting jet-borne particles together into layers to build up solid structures. Powders comprising a single material or blends of two or more materials may be employed. Malleable and/or ductile particles such as metallic powders may be entrained in a high-velocity gas jet and partially melt upon impact due to adiabatic heating, bonding by surface fusion to layers of fused impacted particles. As described in greater detail below, malleable particles may also deform upon impact and elongate into flattened lamellae upon impact, and may build upon each other to form lamellar stacks. Lamellae may range in size from 10 microns to 50 microns or more. Lamellar boundaries may or may not be visible at magnifications less than 500× (e.g., in unprocessed micrographs).

In some embodiments, plugs 107 and other features formed by cold spraying may have a non-zero porosity (e.g., voiding area that may be measured by electron microscopy in terms of percentages of cross-sectional area). Voiding areas may be between 0.1% and 0.5%, for example, as voids may be present at lamellar boundaries between fused particles within the bulk of the supplemental material within plugs 107. In some embodiments, voids are also present at the interface (e.g., interface 703 in FIG. 7) between plugs 107 and template substrate 101. This is contrasted with the microstructure of common bulk materials such as sheet metals (e.g., as may be used for template substrate 101) formed by rolling and/or extruding metal ingots or molten metal. Voiding in such bulk materials (that may be employed in template substrate 101) may be substantially absent. In some embodiments, voiding in bulk materials in template substrate 101 may be less than 0.1% (e.g., 0%) The existence of voids, particularly within the bulk of the plugs 107 and other features formed by cold spraying, is indicative of the supplemental material features having been formed by a HTAM process, such as cold spray deposition (or other thermal spray processes). Voiding area is generally a well-characterized quality control parameter monitored in spray deposition processes. Hence, a non-zero voiding area within plugs 107 and other features comprising the supplemental material coupled with template material (e.g., the material comprised by template substrate 101) having a much lower voiding area (e.g., substantially zero) is indicative of customized microfluidic heat spreader fluid paths in accordance with some embodiments herein.

In some embodiments, the supplemental material employed in plugs 107 comprises a composite of low ductility (e.g., brittle) particles embedded within a matrix comprising a ductile and/or malleable material, such as described above. In some embodiments, the low-ductility (e.g., brittle) material may have a high thermal conductivity κ (e.g., κ>200 W/m-K). Exemplary ductile and/or malleable materials may include most metals, such as, but not limited to, copper, aluminum, iron/nickel alloys such as steel, and other metals and alloys of metals noted above. Examples of suitable brittle materials include, but are not limited to, silicon carbide, aluminum nitride, boron nitride, tungsten and diamond. Powders may comprise pure materials or mixtures or alloys of metals and metals and nonmetals. Particles may range in size from 1 to 50 microns.

Figure 1B:
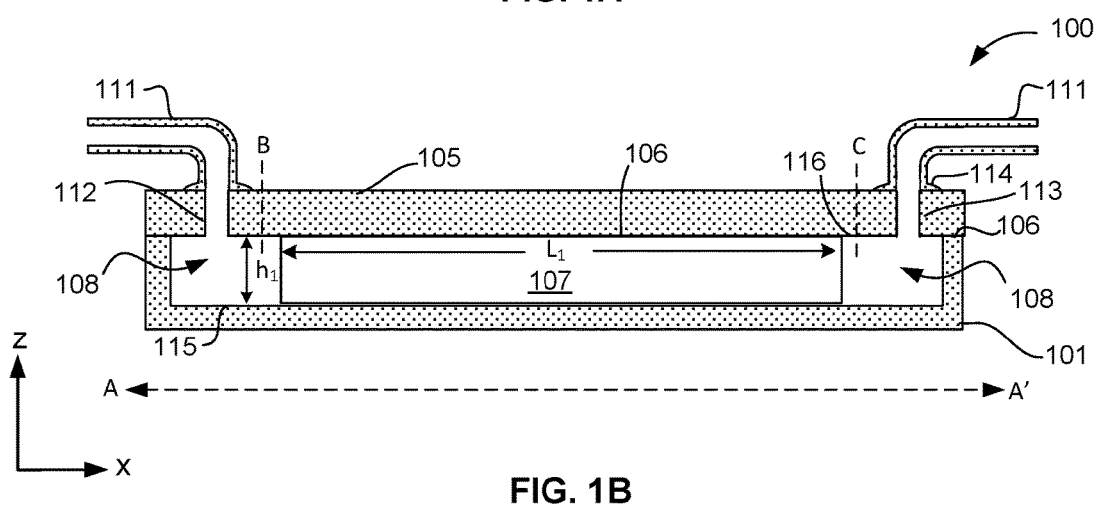
FIG. 1B illustrates a cross-sectional view in the x-z plane of a microfluidic device, according to some embodiments of the disclosure.

Supplemental material may be rapidly deposited into multiple microchannels 102 substantially to the depth of the microchannels (e.g., $h_1$ in FIG. 1B). Plugs 107 and other similar features may be formed by deposition of supplemental material through a shadow mask or through moving or stationary micronozzle arrays, as described below. Cold spraying is known to produce deposition rates of multiple tens of millimeters per second, potentially permitting hundreds or thousands of parts such as template substrate 101 to be made per hour.

Hotspots can develop within high performance IC chips during burst periods and at other peak demand times, where excess heat from hotspots may excessively heat regions of the IC chip, causing reductions in device performance to control rising temperatures. Large lateral thermal gradients may develop across the IC chip, which may exacerbate warpage among other undesirable consequences. For some implementations, microchannel configurations on template substrate 101 may be customized to a concentrate coolant flow over known hotspots of a particular IC chip by selectively backfilling one or more of microchannels 102 with supplemental material (cross-hatched regions as shown in FIG. 1A) across most or all of the length to avoid dead spots/voids within microfluidic device 100. Plugs are formed within the selected microchannels to detour coolant flow into microchannels that remain open. In parallel, the microchannel plugs are high-conductivity structures that may blend thermally (e.g., have substantially the same thermal characteristics) with the surrounding template substrate material, effectively forming contiguous heat transfer media with template substrate 101. Heat transfer rates within template substrate 101 may remain high within the regions where supplemental material 107 has been deposited to avoid islands of high thermal resistance that would otherwise reduce the effectiveness of device 100.

Customization of template substrate 101 by blocking some microchannels with plugs 107 may provide an optimal microchannel configuration for highly effective thermal control of any type of IC chip (e.g., a microprocessor or GPU). As an example, some of the microchannels provided on a generic template (e.g., peripheral microchannels 102 on template substrate 101 as shown) may coincide with thermally stable areas of a high-performance IC chip, and may not be necessary for thermal control of these areas where passive heat conduction (e.g., spreading) may be sufficient. These microchannels may be effectively removed from the template by backfilling them with supplemental material 107. Coolant may then be circulated only within microchannels 102 crossing over hotspots that develop at known locations on the IC chip. These microchannels may remain open (white) so that coolant may be directed to flow over the hotspots and remove the excess heat more efficiently by forced convection rather than relying strictly on passive conductive heat transfer. For example, a microprocessor (not shown) in thermal contact with device 100 that may otherwise develop hot spots in regions delineated by the dashed rectangles may be better cooled by plugging the microchannels that do not cross over these regions. Template substrate 101 may therefore be customized to provide optimal cooling for the particular microprocessor (or other IC device). Limiting fluid flow to be primarily over the hotspot regions may reduce pumping, coolant volume and other heat exchanger requirements. As noted above, plugs 107 may have a composition similar to template substrate 101, and therefore may conduct heat in a substantially identical manner as does the surrounding substrate material.

Microchannels 102 of length $L_1$ extend across template substrate 101 terminating at plena 108 (illustrated as being partially covered by lid 105). Microchannels 102 intersect each plenum 108 on its inner side (indicated by dotted lines 109 and 110), whereby each plenum 108 is a manifold conduit opening into microchannels 102. While microchannels 102 are shown to extend orthogonally from each plenum 108 in the illustrated embodiment, microchannels 102 may extend obliquely across template substrate 101, joining each plenum at non-orthogonal angles.

To reduce hydrodynamic resistances within the fluid flow path, plena 108 may have other than rectilinear forms as shown in the FIG. 1A. In some embodiments, adjacent microchannels 102 may have slight variations in length. For example, the lengths of adjacent microchannels may increase linearly, parabolically, sinusoidally or otherwise non-linearly in length outward from a central microchannel, whereby inner sides 109 and 110 are curved (e.g., follow a convex arc). Microchannels 102 may be shaped to radially intersect curved inner sides 109 and 110.

Fluid conduits 111 comprising copper, steel, aluminum or polymer narrow bore tubing terminate at ports 112 and 113 over plena 108. Ports 112 and 113 may be employed as inlet and outlet ports (ports 112 or 113 may be an inlet port or an outlet port and vice-versa) for coupling heat spreader 100 to an external coolant circuit.

FIG. 1B illustrates a cross-sectional view in the x-z plane of microfluidic device 100, according to some embodiments of the disclosure.

The cross-sectional view of device 100 is taken along plane A-A' along the x-z plane of FIG. 1A, approximately through the center of heat spreader. Lid 105 is shown as a complete structure, which may be bonded to top surface 106 at least template substrate 101 (vertical dashed lines labeled 'B' and 'C' indicate the location of the cutaway opening shown in FIG. 1A for reference). Optionally, lid 105 may also be bonded to top surface 106 of plug 107. Ports 112 and 113 extend through lid 105 near its periphery and open into plena 108. In the illustrated embodiment, fluid conduits 111 are attached to lid 105 by weld beads 114. In other embodiments, fluid conduits 111 may be coupled to lid 105 by suitable tubing fittings (e.g., tubing compression fittings).

In the illustrated embodiment, plugs 107 substantially span the length $L_1$ and z-height $h_1$ of the microchannels (e.g., microchannels 102) they fill, extending from microchannel floor 115 to bottom surface 116 of lid 105. In other embodiments, plugs 107 may partially span the microchannel z-height $h_1$ as flow restrictions, for example filling microchannels between 10% and 90% of their z-height $h_1$. In still further embodiments (not shown), adjacent microchannels may include supplemental material flow restrictions having different z-heights than the illustrated microchannel.

Figure 1C:
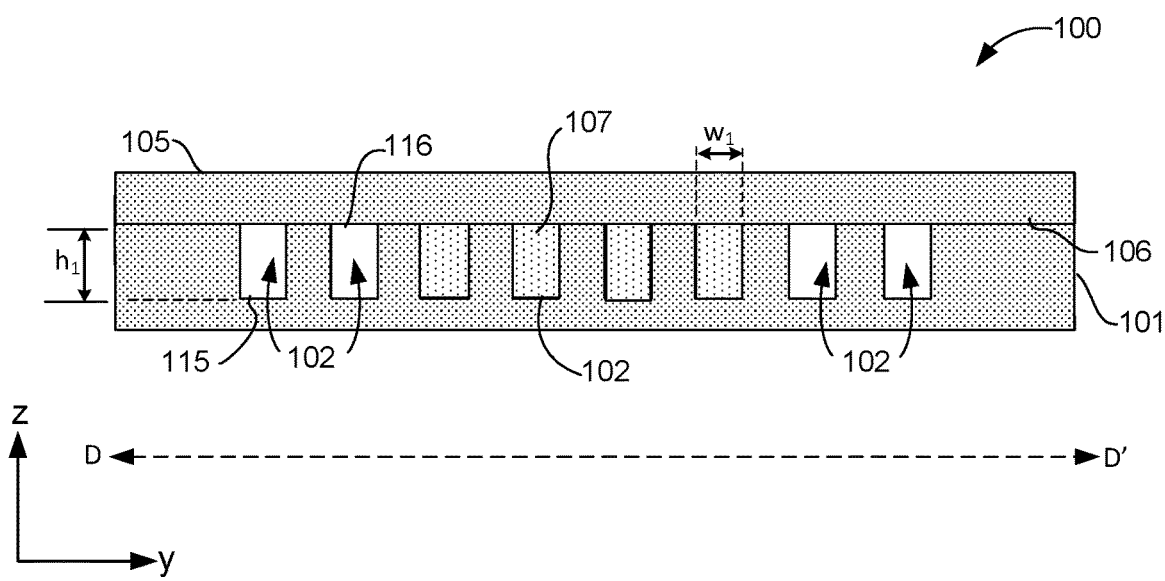
FIG. 1C illustrates a cross-sectional view in the y-z plane of a microfluidic device, according to some embodiments of the disclosure.

FIG. 1C illustrates a cross-sectional view in the y-z plane of customizable microfluidic heat spreader 100, according to some embodiments of the disclosure.

The cross-sectional view of heat spreader 100 is taken along y-z plane D-D', of FIG. 1A. Template substrate 101 comprises multiple parallel microchannels 102, extending within the substrate in the x-direction of the figure. Other suitable configurations of microchannels 102 may be formed within substrate material by an upstream manufacturing process, as shown below. Plugs 107 (cross-hatched regions) may be formed within microchannels 102 by HTAM processes, such as the cold spray process described above. Plugs 107 occupy substantially the entire cross section of the backfilled microchannels 102. In the illustrated embodiment, plugs 107 span substantially the vertical distance (z-height) and the width $w_1$ of microchannels 102 fully blocking the backfilled microchannels.

Microchannels 102 near the periphery of template substrate 101 are free of supplemental material. As noted above, template substrate 101 may be customized according to heat generation maps of specific IC chips. For example, plugs 107 are within microchannels coinciding with the lower power regions of a particular high-performance IC device that is to be thermally contacted to device 100. By blocking these microchannels, coolant circulation is withheld from low power regions of the IC chip for which conductive heat transfer modes through the solid materials of device 100 are sufficient. Coolant circulation is reserved for the open microchannels that coincide with hot spot regions of the high-performance IC device. By restricting coolant circulation to microchannels that coincide with hotspots, less coolant volume flow rate may be needed through heat spreader 100, reducing pumping, tubing and heat exchanger demands.

Template substrate 101 may be manufactured with a single pattern of microchannels 102, as shown in FIGS. 1A-1C. Template substrate 101 itself may be preformed with any suitable pattern, number and dimensions of microchannels.

Figure 1D:
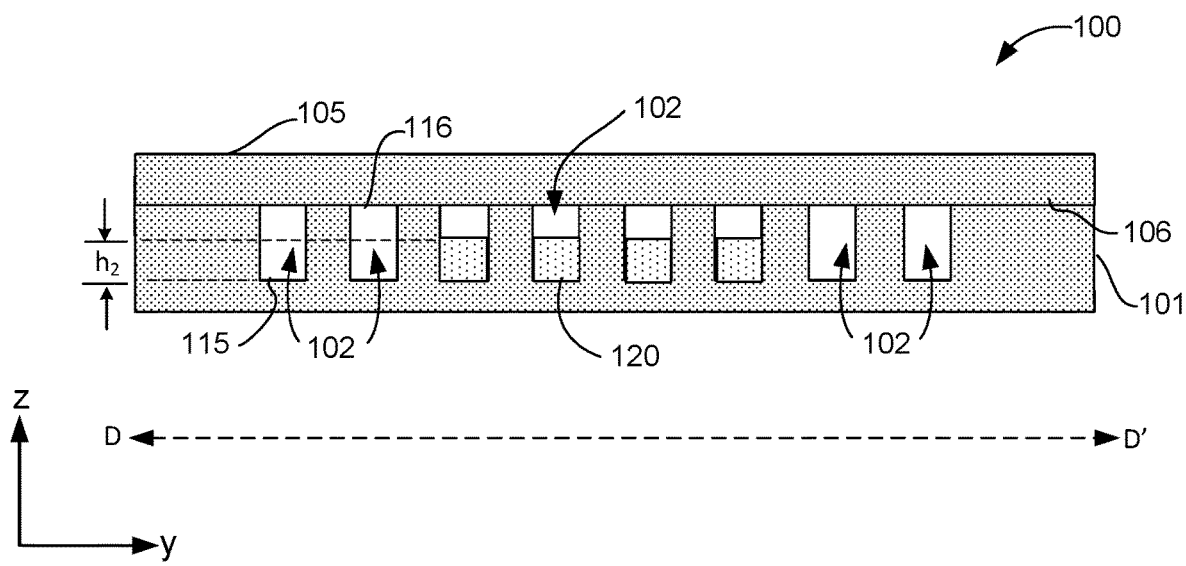
FIG. 1D illustrates a cross-sectional view in the y-z plane of a microfluidic device, according to some embodiments of the disclosure.

FIG. 1D illustrates a cross-sectional view in the y-z plane of microfluidic device 100, according to some embodiments of the disclosure.

The cross-sectional view of FIG. 1D is again taken along y-z plane D-D' from FIG. 1A. Microchannels 102 in the central portion of template substrate 101 are partially backfilled with supplemental material to form partial plugs 120 having a z-height $h_2$ ($h_2 < h_1$). Partial plugs 120 may occupy a portion (e.g., approximately half as shown) of the depth $h_1$ of microchannels 102. Z-height $h_2$ of partial plugs 120 may be any suitable value between zero and $h_1$. In implementations of heat spreader 100, partial plugs 120 may function as flow restrictions, permitting a limited amount of coolant to flow within the affected microchannels.

In some embodiments, the length of partial plugs 120 (extending in the x-direction) may be the complete length (e.g., $L_1$ in FIGS. 1A and 1B) of microchannels 102 or a portion thereof. Both the length and the z-height $h_2$ of partial plugs 120 may be adjusted to limit the flow rate of coolant within the affected microchannels 102 to a desired fraction of the coolant flow rate that occurs in the open microchannels at a specified pump pressure. The reduced coolant flow may permit limited convective cooling to take place in addition to conductive heat transfer from thermally stable regions of a high-performance IC device thermally coupled to heat spreader 100.

Figure 2A:
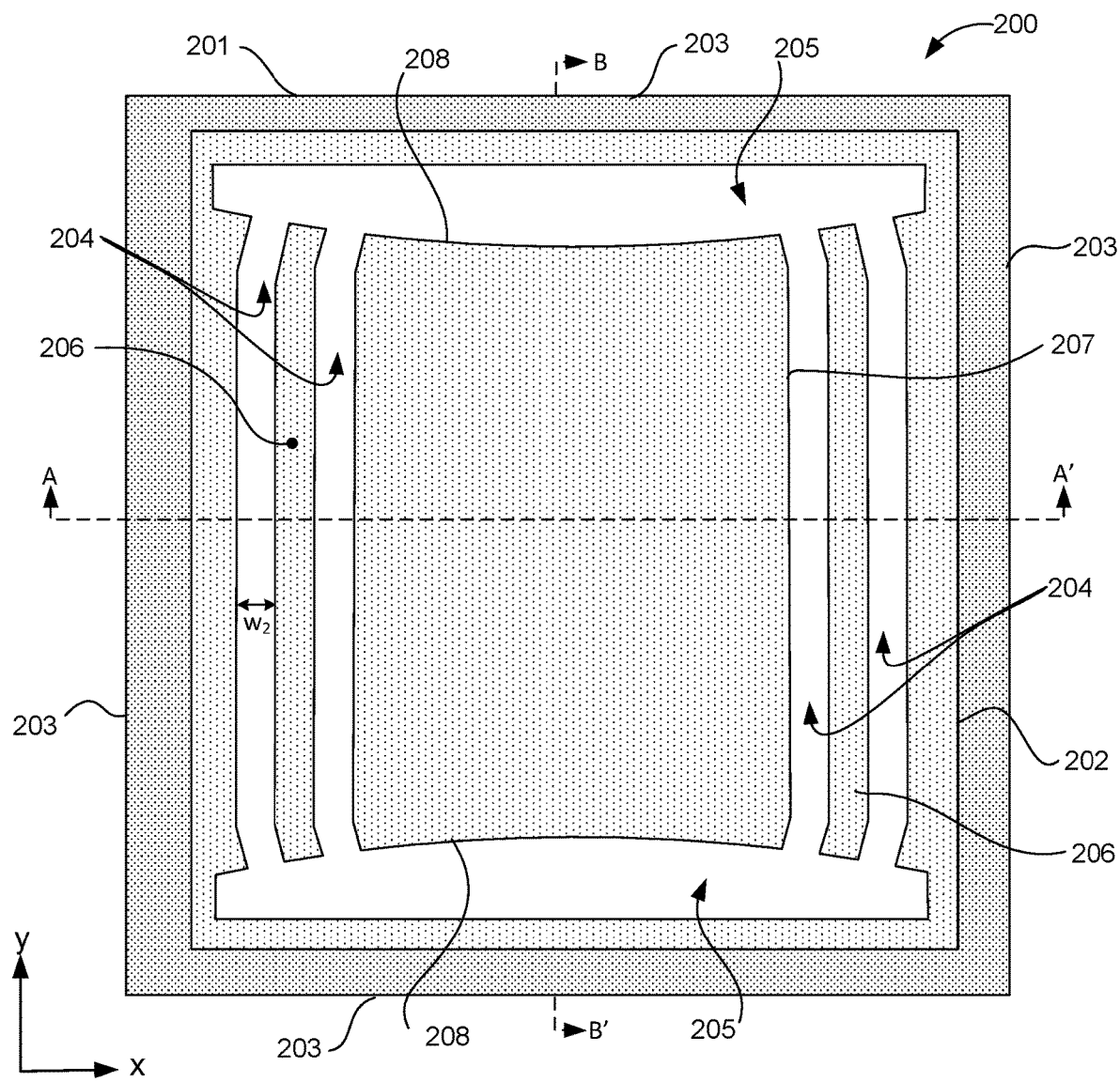
FIG. 2A illustrates a plan view in the x-y plane of a microfluidic device, according to some embodiments of the disclosure.

FIG. 2A illustrates a plan view in the x-y plane of microfluidic device 200, according to some embodiments of the disclosure.

Device 200 is shown in the plan view with its lid (e.g., lid 209 illustrated in FIG. 2B) removed to show interior features. FIG. 2A shows a plan view of template substrate 201 and overlying microfluidic features. Template substrate 201 comprises a material of high thermal conductivity, such as copper, aluminum, or any other suitable materials, such as those described above. Template substrate 201 may have lateral dimensions ranging between 5 and 100 millimeters, and a thickness ranging between 100 and 5000 microns. In some embodiments, template substrate 201 comprises a rectangular recess 202 within a central region surrounded by sidewalls 203 (stippled regions comprising substrate material) along the periphery of template substrate 201. In some embodiments, template substrate 201 may comprise an unstructured rectangular sheet of a suitable base material such as extruded sheet metal. Template substrate 201 may have a simpler three-dimensional structure than template substrate 101 shown in FIGS. 1A-1D, permitting rapid on-demand production of microfluidic features by HTAM deposition of supplemental material customized to suit thermal requirements of specific IC chips on an on-demand basis. For example, template substrate 201 may be featureless beyond defining an enclosure, or comprise a single stamped or molded feature such as recess 202 in which custom microfluidic features may be rapidly formed by a HTAM process.

Features such as microchannels 204 may be formed over template substrate 201 by HTAM (e.g., cold spray) deposition of the supplemental material, which has been previously described. Microfluidic structures such as microchannels 204 and plena 205 may be formed within supplemental material deposited on template substrate 201 by, for example, HTAM cold spraying of a suitable powder. As an example, microchannels 204 and plena 205 may be formed as negative features by cold spraying a suitable powder through a shadow mask. Alternatively, microfluidic structures (e.g., microchannels 204) may be formed by direct writing of supplemental material to form ridges 206 separating microchannels 204 and pad 207 covering the central portion of template substrate 201, as well as peripheral sidewalls 206. Microchannels 204 may extend within the supplemental material layer between plena 205.

In the embodiment shown in FIG. 2A, two sets of microchannels 204 extend across peripheral portions on opposing sides of template substrate 201, while pad 207 occupies the central portion of template substrate and may host no further microfluidic structures. In alternate embodiments, additional microchannels may extend over the central portion of template substrate 201. Any desired combination of microfluidic features may be formed on template substrate 201 by choice of mask or direct-write pattern for the HTAM process (e.g., cold spray). In the embodiment shown in FIG. 2A, template substrate comprises recess 202 into which supplemental material may be deposited to a depth that may be substantially the z-height of recess sidewalls 203. Microchannels 204 and plena 205 formed within supplemental material deposited in recess 202 may have approximately the same z-height as sidewalls 203.

Microfluidic features such as microchannels 204 and plena 205 may be shaped to suit cooling and pumping requirements. For example, dimensions of microchannels 204, particularly width $w_2$ of microchannels 204, may be adjusted to accommodate desired coolant flow rates and pressure drops. In the embodiment shown in FIG. 2A, plena 205 have curved inner sidewalls 208 that may lower resistance to the flow of coolant entering into microchannels from the inlet port and from flow exiting microchannels into the outlet port (shown in FIG. 2C). The curvature of inner sidewalls 208 may follow parabolic, elliptical, sinusoidal or any suitable arc. In some embodiments, inner sidewalls 208 may be rectilinear (e.g., straight) or have linear segments. The channel widths may also be adjusted to allow for lower hydrodynamic resistance of some channels. The inlet and outlet manifolds may also have some coolant flow features (e.g. additional walls) to direct the coolant flow and control areas of turbulent flow.

Figure 2B:
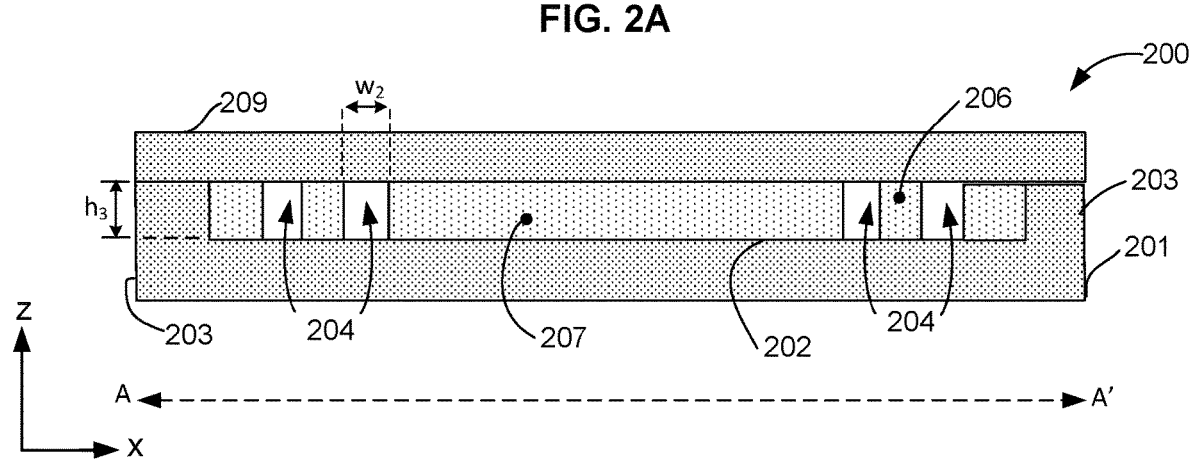
FIG. 2B illustrates a cross-sectional view in the x-z plane of a microfluidic device, according to some embodiments of the disclosure.

FIG. 2B illustrates a cross-sectional view in the x-z plane of microfluidic device 200, according to some embodiments of the disclosure.

The cross-sectional view of FIG. 2B is taken along x-z plane A-A' in FIG. 2A. Features comprising supplemental material (e.g., ridges 206 and pad 207) may have a depth $h_3$ that may be substantially the z-height of recess 202. Lid 209 may be bonded to tops of sidewalls 203 comprising substrate material, and may be bonded to ridges 206 and other regions comprising supplemental material, forming a seal around the microfluidic structures including microchannels 204. Depth $h_3$ and width $w_2$ of microchannels 204 may be adjusted to meet coolant flow rate and pressure drop requirements. In some embodiments, constrictions may be included within microchannels 204 by forming one or more microchannels having at least one narrow portion along the length of the microchannels to limit coolant flow.

Figure 2C:
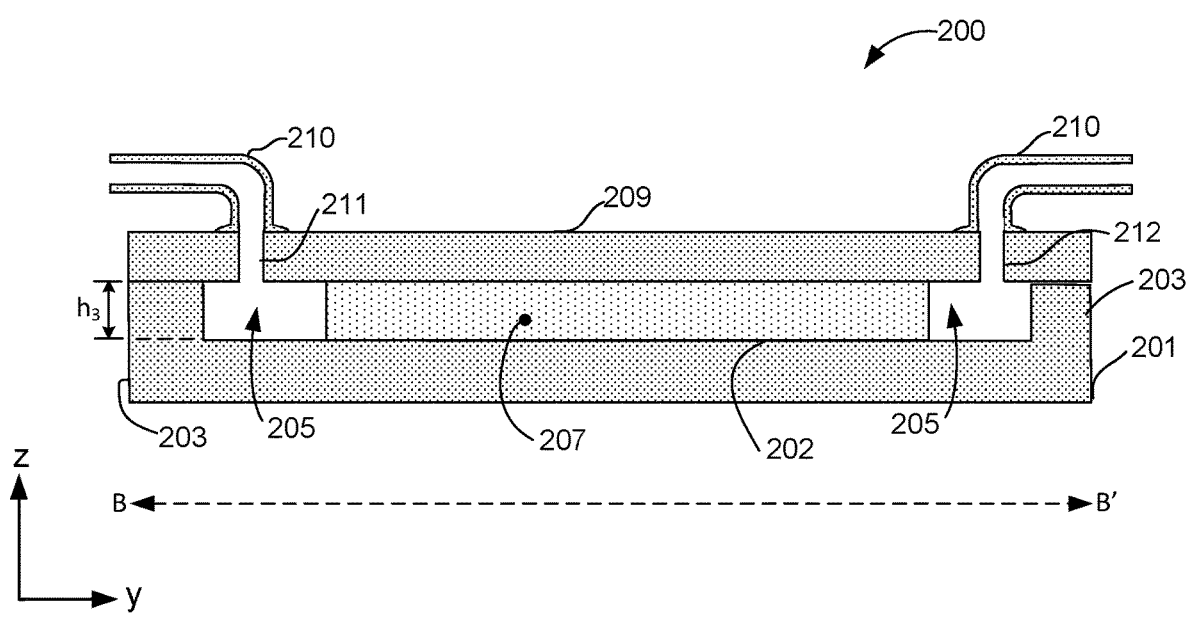
FIG. 2C illustrates a cross-sectional view in the y-z plane of a microfluidic device, according to some embodiments of the disclosure.

FIG. 2C illustrates a cross-sectional view in the y-z plane of customizable microfluidic heat spreader 200, according to some embodiments of the disclosure.

The cross-sectional view of FIG. 2C is taken along y-z plane B-B' in FIG. 2A. Fluid conduits 210 (similar to fluid conduits 111 in FIGS. 1A and 1B) are coupled to plena 205 through ports 211 and 212 extending through lid 209. While fluid conduits 210 may be welded to lid 209 as shown in FIG. 2C. In some embodiments, fittings (e.g., compression nuts, not shown) may be included at the ends of fluid conduits to couple fluid conduits 210 to lid 209. Fluid conduits 210 may be part of an external coolant circulation circuit comprising a pump and heat exchanger. The symmetrical configuration of the microfluidic features of heat spreader 200, either fluid port 211 or 212 may be an inlet or an outlet port.

Figure 3A:
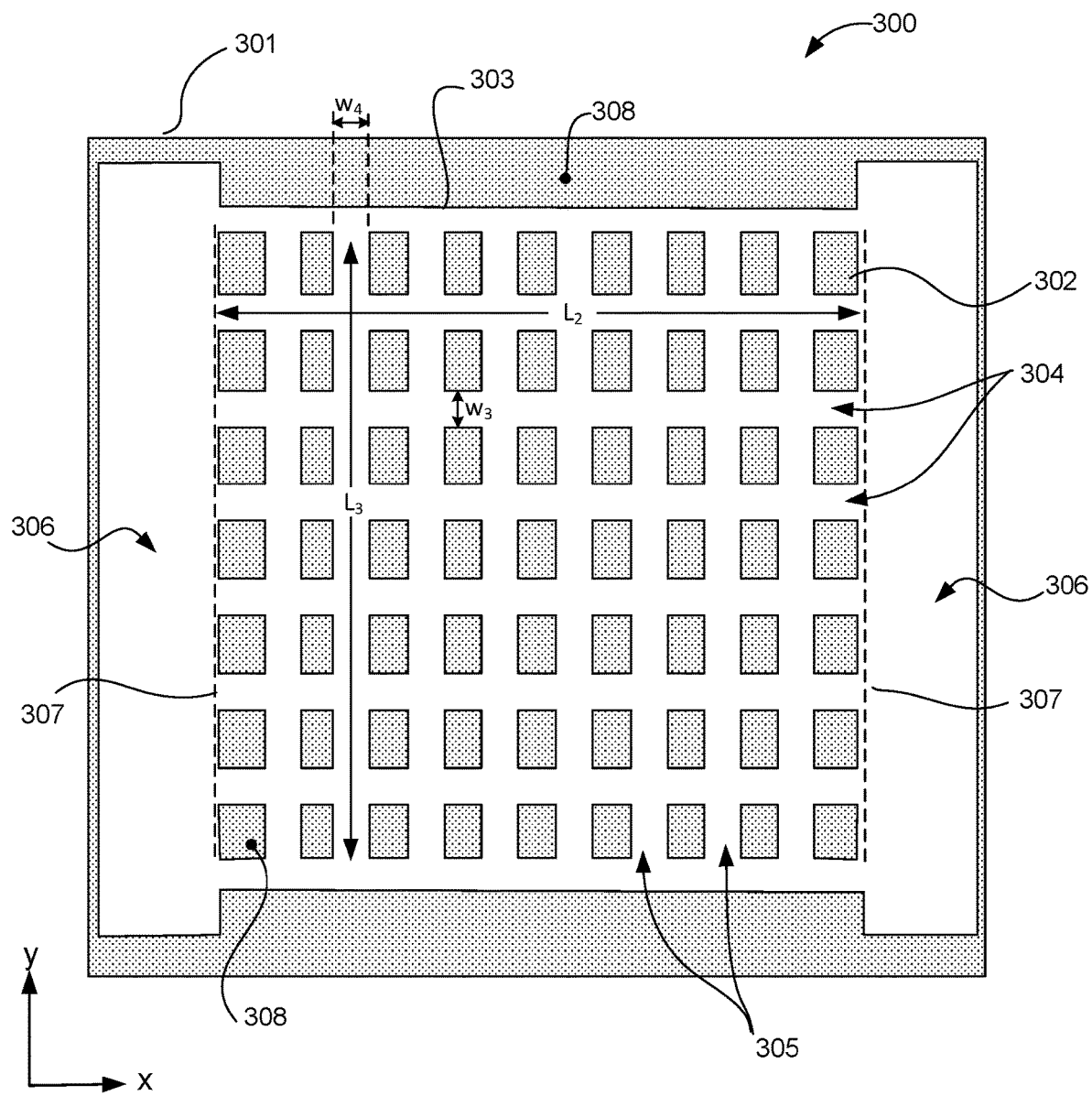
FIG. 3A illustrates a plan view in the x-y plane of a microfluidic device, showing a template substrate in a pre-configured state, according to some embodiments of the disclosure.

FIG. 3A illustrates a plan view in the x-y plane of a microfluidic device 300, showing template substrate 301 in a pre-configured state, according to some embodiments of the disclosure.

Figure 3B:
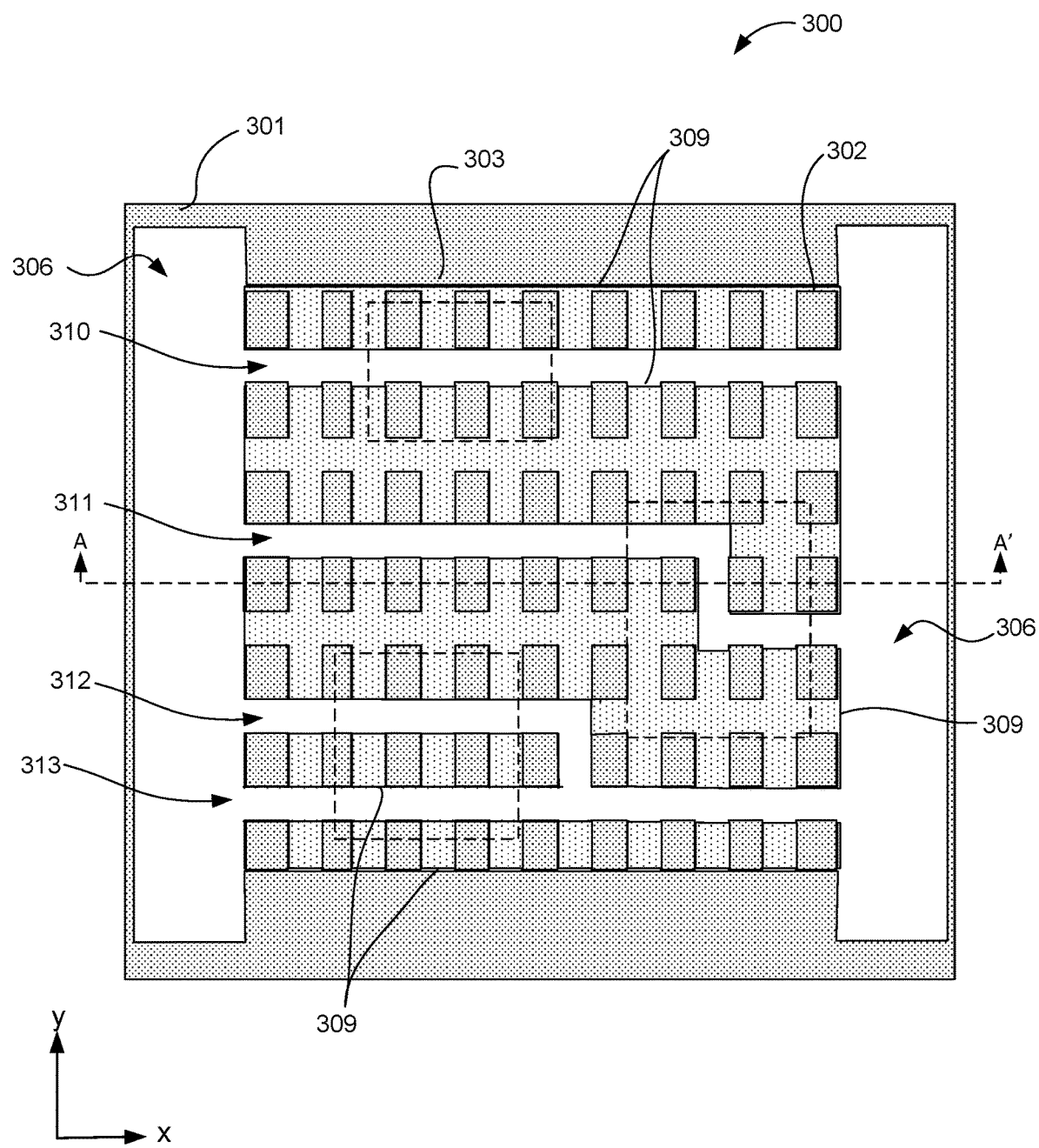
FIG. 3B illustrates a plan view in the x-y plane of a microfluidic device, showing the template substrate in a post-configured state, according to some embodiments of the disclosure.

Device 300 comprises template substrate 301, having multiple rectangular pillars 302 arranged in a grid within recess 303. Pillars 302 and recess 303 may be formed with substrate material (described above) by molding, stamping, etching or mechanical machining of a suitable planar sheet metal workpiece. Template substrate 301 is shown in a bare pre-configured state, before HTAM processing (template substrate 301 configured with customized microfluidic flow paths after HTAM processing is shown in FIG. 3B). The grid of pillars 302 may be configured by HTAM processing to have any number and combination of customized microchannels within the geometrical limits imposed by the size of the grid and number of pillars 302.

Figure 3C:
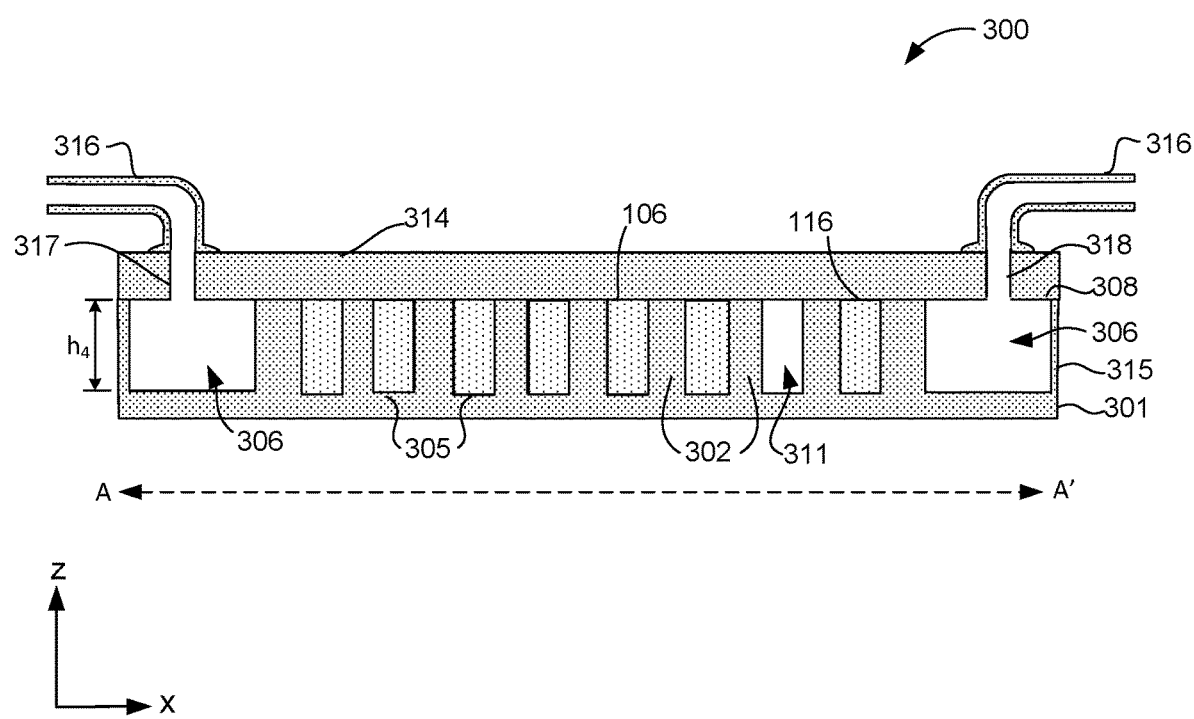
FIG. 3C illustrates a cross-sectional view in the x-z plane of a microfluidic device, according to some embodiments of the disclosure.

Pillars 302 and the substrate periphery surrounding recess 303 may have a uniform z-height (shown in FIG. 3C). Between pillars 302 are multiple orthogonally-running microchannels 304 and 305. Microchannels 304 extend a length $L_2$ across recess 303 in the x-direction as grid rows between pillars 302, opening into plena 306 at both ends. Microchannels 305 extend a length $L_3$ across recess 303 in the y-direction as grid columns between pillars 302, running orthogonally to microchannels 304. Microchannels 304 and 305 may cross each other at multiple grid row and column intersection. While in the illustrated embodiment, microchannels 304 and 305 have rectangular cross sections, in other embodiments, microchannel cross sections may have round or other suitable cross sections.

Widths $w_3$ of microchannels 304 may vary between adjacent microchannels, or along lengths $L_2$ of individual microchannels 304. Similarly, widths $w_4$ of microchannels 305 may vary between adjacent microchannels or along lengths $L_3$ of individual microchannels 305. In the illustrated embodiment, widths $w_2$ and $w_3$ are constant between adjacent microchannels and along individual microchannels.

Plena 306 flank recess 303 on opposing sides, and are contiguous with microchannels 304, forming manifolds on each side of recess 303. Plena 306 may have the same depth as microchannels 304 (shown in FIG. 3C). While in the illustrated embodiment plena 306 have rectilinear sidewalls, in some embodiments, in particular inner sidewalls 307 indicated by the vertical dashed lines of plena 306 are curved or otherwise not rectilinear.

Device 300 also comprises a lid (e.g., lid 314 in FIG. 3C) that is attached to template substrate 301. The lid is indicated by the dashed outline surrounding template substrate 301 in the figure, and is shown in cross section in FIG. 3C. The lid may be hermetically bonded to bonding surfaces 308 of template features (pillars 302 and peripheral areas of template substrate 301 surrounding recess 303) by brazing, solder or adhesion by an organic adhesive, for example, capping the microfluidic structures.

FIG. 3B illustrates a plan view in the x-y plane of microfluidic device 300, showing template substrate 301 as customized by supplemental material, according to some embodiments of the disclosure.

In a post-configured state, template substrate hosts supplemental material blocks 309. Blocks 309 may be HTAM structures formed by depositing supplemental material within spaces between multiple pillars 302 employing a HTAM process (e.g., cold spraying). Blocks 309 may extend in both the x- and y-directions. Between blocks 309 are substantially open microchannels (e.g., microchannels 310, 311, 312 and 313) that may comprise orthogonal segments extending along rows and columns of the grid of pillars 302.

Microchannels (e.g., microchannel 312) may be configured to follow one or two dimensional flow paths between plena 306. Arrows within microchannels 310-313 indicate exemplary directions of flow within each of the microchannels 310-313. Individual two-dimensional microchannels (e.g., microchannels 311-313) may circulate fresh coolant to individual hotspots (indicted by the dashed boxes) within a high-performance IC chip. By following a two-dimensional flow path, customized microchannels may be routed to each individual hotspot without first traversing another hotspot, delivering fresh (e.g., unheated) coolant to each hotspot. The number of potential customizable microchannel configurations increases with the number of pillars 302 in the grid of template substrate 301.

FIG. 3C illustrates a cross-sectional view in the x-z plane of microfluidic device 300, according to some embodiments of the disclosure.

The cross-sectional view of FIG. 3C is taken along x-z plane A-A' in FIG. 3B. Lid 314 may be hermetically bonded to surfaces 308 of pillars 302 and peripheral walls 315 of template substrate 301 surrounding recess 303, capping microfluidic structures (e.g., microchannels 305 and plena 306). Spaces between pillars 302 are cross sections of microchannels 305. In the illustrated embodiment, some adjacent microchannels 305 are shown backfilled with supplemental material (cross-hatched areas). The adjacent pillars 302 may be united by the backfill of supplemental material having substantially a depth $h_4$, interfacing with pillar sidewalls having a z-height $h_4$, which may comprise a material similar to the pillar material. The group of adjacent pillars 302 united by supplemental backfill is a cross section of a block 309 shown in FIG. 3B.

Fluid conduits 316 are coupled to plena 306 by ports 317 and 318, extending through lid 314 over plena 306. While fluid conduits 316 may be welded to lid 314 as shown in FIG. 3C. In some embodiments, fittings (e.g., compression nuts, not shown) may be included at the ends of fluid conduits to couple fluid conduits 316 to lid 314. As noted above, fluid conduits 316 may be part of an external coolant circulation circuit comprising a pump and heat exchanger.

The symmetrical configuration of the microfluidic features of heat spreader 300, either fluid port 317 or 318 may be an inlet or an outlet port.

Figure 4:
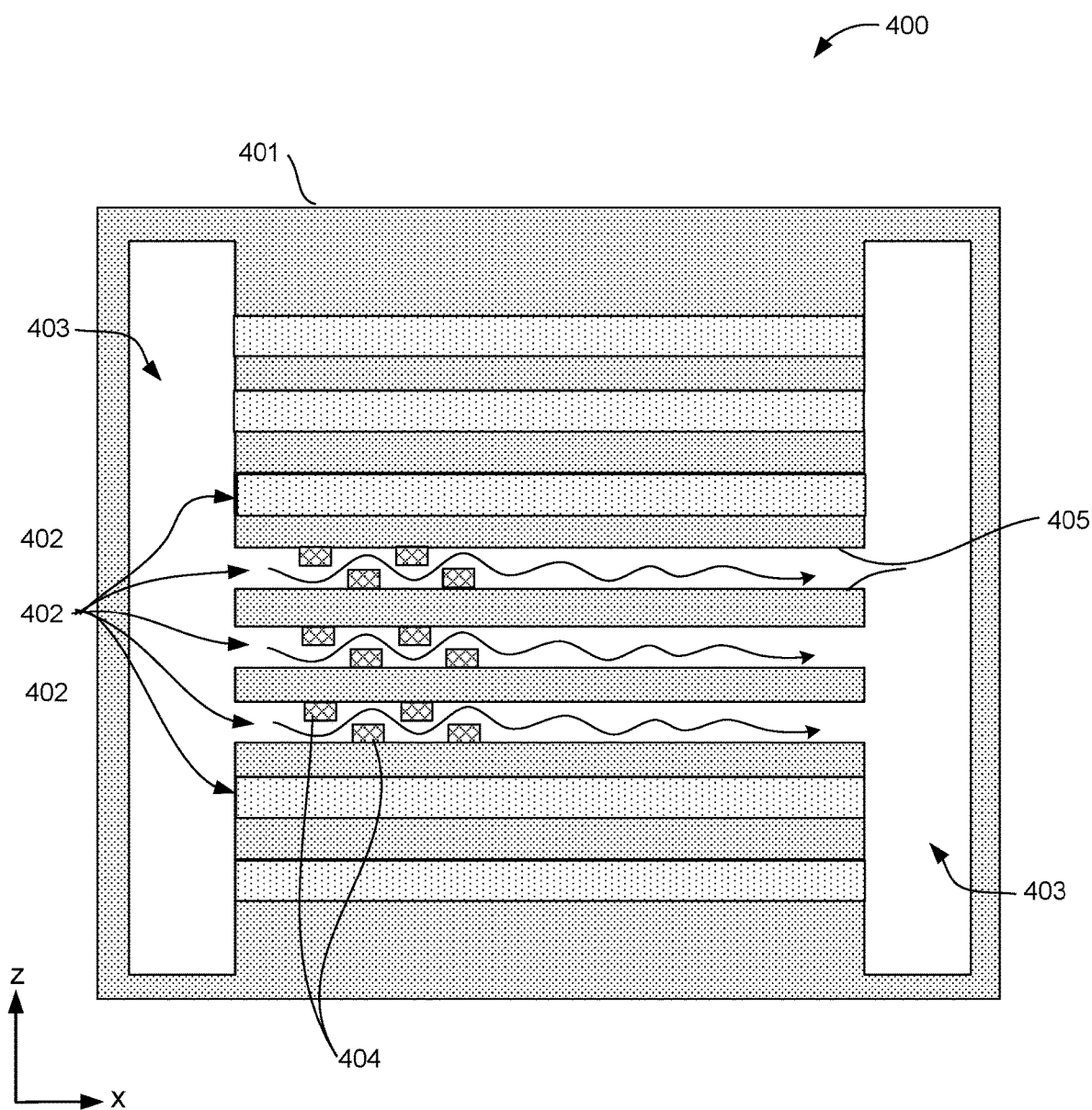
FIG. 4 illustrates a plan view in the x-y plane of a microfluidic device, according to some embodiments of the disclosure.

FIG. 4 illustrates a plan view in the x-y plane of microfluidic device 400, according to some embodiments of the disclosure.

Device 400 comprises configurable template substrate 401, comprising multiple parallel microchannels 402 extending in the x-direction between plena 403 within substrate material. Formation of microchannels 402 within the substrate material has been previously described. In the illustrated embodiment, microchannels 402 extending through the central portion of template substrate 401 are customized with baffles 404 formed by HTAM deposition of supplemental material on opposing sidewalls 405 of the customized microchannels 402. Baffles 404 may partially obstruct laminar coolant flow, diverting the flow laterally to induce turbulent and other non-laminar streamlines with the flow. Constrictions in the microchannel cross section introduced by baffles 404 regions may increase flow velocity and Reynolds number. Convective heat transfer may be enhanced by the induced turbulent flow, which increases the local heat transfer coefficient by reducing the local boundary layer thickness. Multiple baffles 404 may be alternated on opposite sidewalls 405. Placement of baffles within a hotspot region, depicted by dashed outlines, may significantly increase convective heat transfer without increasing pumping pressure or flow volume. Heat transfer from hotspots downstream of a baffled portion of microchannels 402 may also benefit by the induced turbulent or non-laminar flow without necessitating local baffles.

Figure 5:
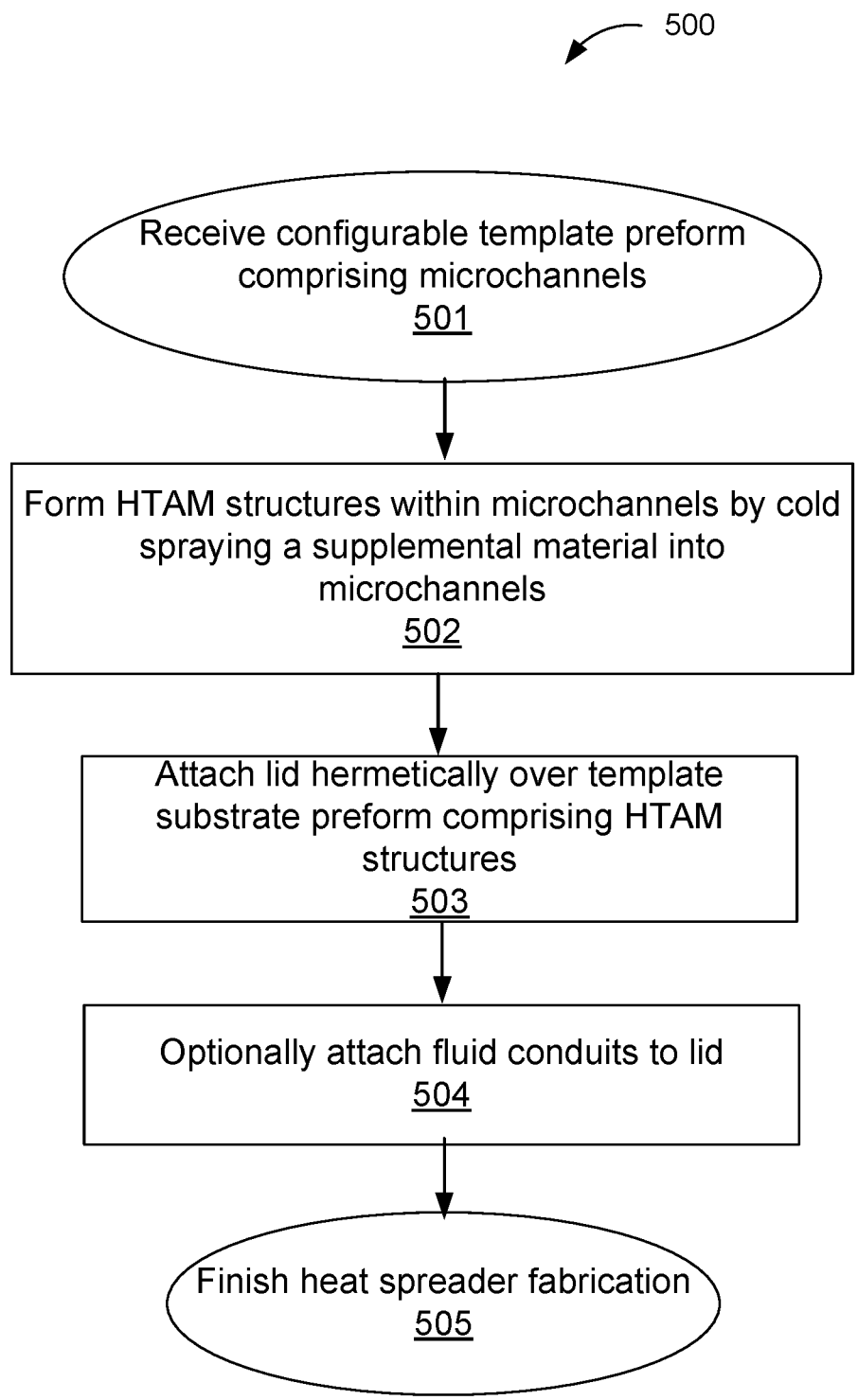
FIG. 5 is an exemplary process flow chart for making a microfluidic device, according to some embodiments of the disclosure.

FIG. 5 is an exemplary process flow chart for the fabrication of any one of microfluidic devices 100, 200, 300 or 400, according to some embodiments of the disclosure.

At operation 501, a customizable template preform is received from a separate fabrication line for assembly into a microfluidic device that will be included into an IC package for a high-performance IC device such as a microprocessor, a graphical processing unit, or a field-programmable gate array, etc. The customizable preform may be selected from a stock of similar template substrates that have been previously fabricated. The preform may be fabricated from a planar workpiece comprising an extruded or (hot or cold) rolled and annealed metal sheet (e.g. copper foil) having a thickness ranging between 300 and 2000 microns. The bulk microstructure of the template substrate material may be polycrystalline, comprising metal grains ranging in size from several tens of microns to 2 millimeters). Void area percentage, as measured by cross section, for example, may be less than 0.1%.

In some embodiments, the microfluidic template features such as microchannels may have been formed in the preform material by a subtractive manufacturing process such as stamping, etching or mechanical machining of a workpiece. Surface roughness of the formed template features, such as microchannels formed by etching or stamping, may be less than the unprocessed surfaces of the substrate. Mechanical machining may increase the average surface roughness of the formed features. As an example, the unprocessed surfaces of the template may have an average surface roughness of 1 micron or less (e.g., a typical average surface roughness Ra for cold-rolled sheet steel).

In some embodiments, the preform is fabricated by an additive manufacturing process, such as cold spraying, thermal spraying or 3D printing. Cold and thermal spray powder processes in the context of supplement material deposition are explained in more detail below, but similar processes may also be employed to form a template substrate. These are considered high-throughput processes (e.g., a HTAM process), whereas 3D printing is generally a slower process than the spray processes. 3D printing is a well-known manufacturing technique and will not be described further. Materials formed by cold spray or thermal spray processes generally have larger void areas in their microstructure compared to bulk materials having similar or substantially the same compositions. Void areas ranging from 0.1% to 0.5% or greater may be typical of materials formed by cold or thermal spray processes. Further contrasting cold or thermal sprayed materials to conventional bulk materials, the microstructures of cold spray or thermal spray materials may also have large lamellae (typically 50 to 1000 microns, depending on powder) or stacks of lamellae, formed by impacted particles. Lamellar boundaries may be amorphous due to fusion bonding of lamellae. In some embodiments, inclusion of non-metallic particles between lamellae may also be detected or observed by microscopy.

At operation 502, the microchannels (e.g., microchannels 102) on the preform are customized by forming HTAM structures such as plugs (e.g., plugs 107) within the microchannels. Plugs may be formed by backfilling microfluidic channels with a supplemental material. In some embodiments, HTAM structures are formed by cold spraying the supplemental material, described in detail below. In some embodiments, the supplemental material has substantially the same composition as the substrate material. In some embodiments, the supplemental material has a different composition than the preform material, and may comprise a composite of a metal and non-metal.

Cold spraying requires less equipment infrastructure and lower temperatures than thermal spraying, and is generally the method of choice for an HTAM process. Cold spraying is known to deposit hundreds of microns per second of any suitable material. Structures formed by cold spraying may build up in thickness within seconds to one millimeter or more. Many hundreds of customized microchannel substrates may be manufactured in an hour.

At operation 503, a lid is hermetically bonded to at least the template material and may also be bonded to the HTAM structures comprising the supplemental material. In some embodiments, the lid is brazed to the template substrate along bonding surfaces. In some embodiments, the lid is attached by an organic adhesive.

At operation 504, fluid conduits may be added to the lid. The fluid conduits may be part of inlet and outlet ports. Further fabrication may be performed to complete to the heat spreader in operation 505.

Figure 6A:
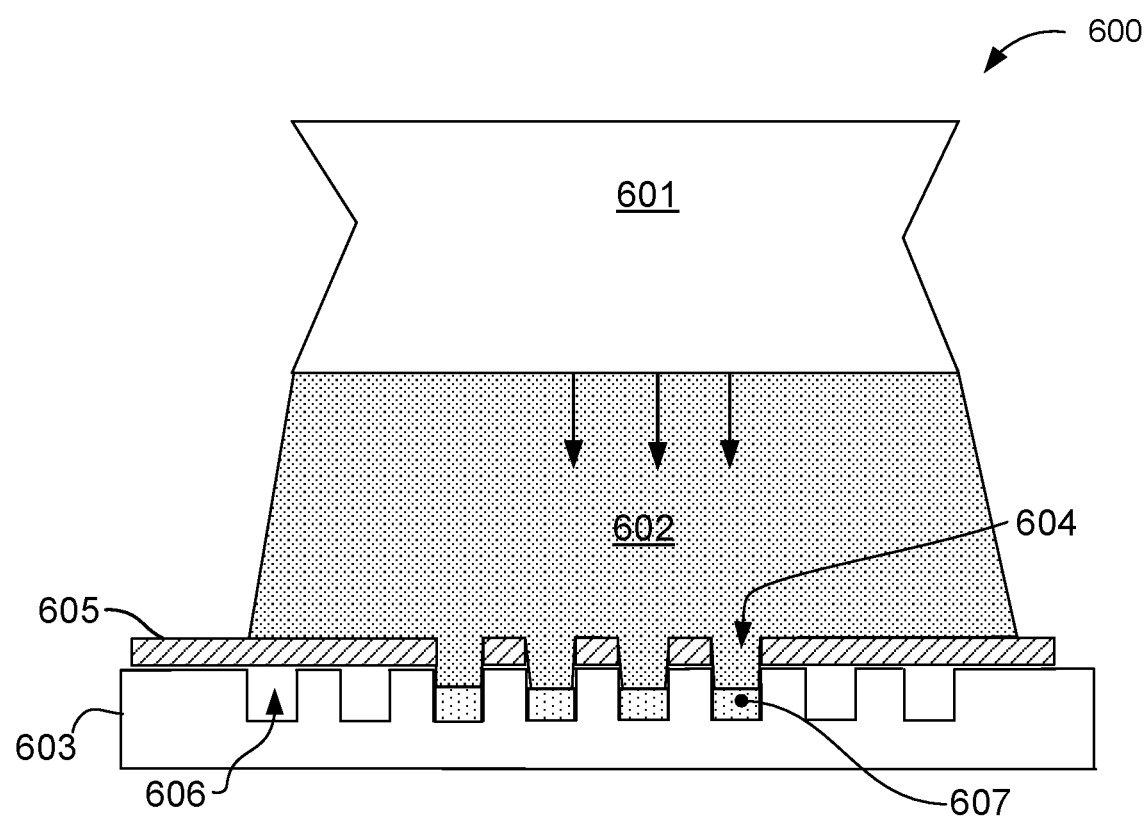
FIG. 6A illustrates an exemplary HTAM cold spray process to form structures within microchannels on a microfluidic template substrate by deposition through a shadow mask, according to some embodiments of the disclosure.

FIG. 6A illustrates an exemplary HTAM cold spray process to form structures within microchannels on a customizable microfluidic template substrate (preform) by deposition through a shadow mask, according to some embodiments of the disclosure.

In the illustrated embodiment, a cold spray apparatus 600 is employed to form supplemental features within microfluidic features on a configurable preform template substrate. In particular, the front end of cold spray apparatus 600 is shown, comprising single macronozzle 601. Cold spray jet 602 is formed from a high-velocity gas passing through nozzle 601, carrying an entrained powder. The powder entrained within jet 602 is directed towards preform template substrate 603, causing the particles to impinge on the preform substrate at high velocity. Cold spray jet 602 may comprise nitrogen, air, argon or helium heated to temperatures between approximately 500° C. and 800° C. A suitable powder comprising a supplemental material as described above. Openings (apertures) 604 of shadow mask 605 may be aligned to microchannels 606. HTAM structures 607 such as plugs 107 or flow restrictions 120 (FIGS. 1A-1D) comprising the supplemental material are deposited into microchannel 606 through apertures 604. Structures 607 within microchannels 606 are depicted as in the process of building up in z-height as particles from jet 602 are deposited on the growing structures.

The cold spray deposition process is generally a line-of-sight deposition method, as the powder particles travel in straight lines along a narrow band of off-axis angles within a divergent jet cone. Thus coverage of the substrate surface may depend on the angle between the surface and the jet cone angle. For example, powder particles may have less impingement on vertical or near vertical sidewall surfaces having small angles between the surface and jet cone angle in comparison to surfaces having larger angles. This may be exacerbated by deposition through small microchannel apertures (e.g., small microchannel widths relative to nozzle size) through which the powder jet 602 needs to penetrate. Apertures 604 of shadow mask 605 may be traversed by narrow jets of particles travelling along substantially small angles relative to the jet axis. As a result, little to no impingement of powder particles may occur on vertical or near vertical microchannel sidewalls. Relatively large gaps may be present at sidewall interfaces of HTAM structures 607.

Above a threshold velocity, particles comprising a malleable/ductile supplemental material (e.g., particles comprising a metal) may plastically deform upon impact, forming flattened and elongated or oblong structures (e.g., splats). The splats may adhere to the substrate and subsequently to each other as layers of the hybrid thermal interface is grown. The more brittle material may embed as distinct particles within a matrix formed by the malleable/ductile material. Growth of the hybrid thermal interface by a cold spray process may take place at a rate of 20-40 microns/second.

Figure 6B:
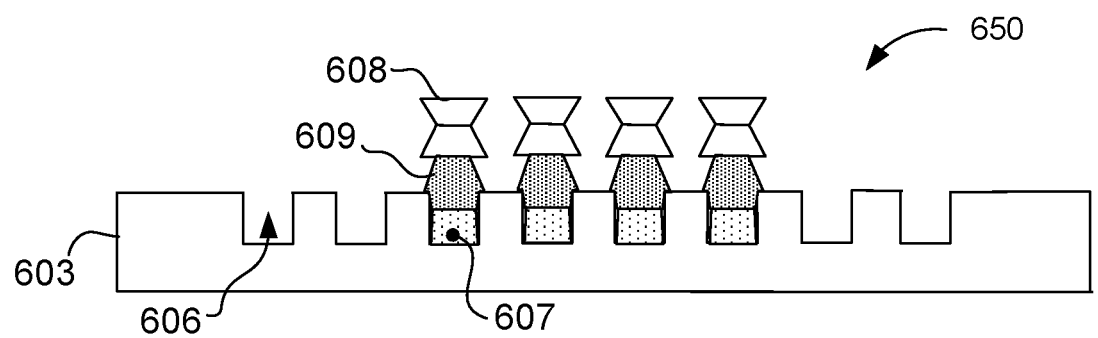
FIG. 6B illustrates an exemplary HTAM cold spray process to form structures within microchannels on a microfluidic template substrate by deposition with a micronozzle array, according to some embodiments of the disclosure.

FIG. 6B illustrates an exemplary HTAM cold spray process to form structures within microchannels on a customizable microfluidic template substrate by deposition with a micronozzle array, according to some embodiments of the disclosure.

In the illustrated embodiment, the front end of cold spray apparatus 650 is shown, comprising an array of one or more micronozzles 608 for localized deposition of supplemental material by a direct-write process into microchannels 606. The principles of the cold spray process outlined above for FIG. 6A also apply to the process shown in FIG. 6B. The scale of the process is miniaturized for each micronozzle 608. Powder jets 609 comprise air or a non-reactive gas as described above, having a powder comprising a suitable supplemental material entrained within the gas jet. Deposition rates of the powder comprising the supplemental material may be substantially the same as for the macronozzle process described above (e.g., generally 20-40 microns per second). Micronozzles 608 may produce narrow jets having particles travelling along substantially vertical lines, thus the angles between microchannel sidewalls and the particle trajectories may be very small, resulting in little to no impingement of powder particles on vertical or near vertical microchannel sidewalls. Relatively large gaps may be present at sidewall interfaces of HTAM structures 607.

In some embodiments, single or multiple micronozzles 608 may be mounted on a gantry system (not shown), where individual micronozzles 608 may translate (e.g., in the y-direction of the figure) along each of the microchannels 606 to spray-deposit supplemental material to form HTAM structures 607 as the micronozzle(s) is(are) displaced. In some embodiments, an array of multiple micronozzles 608 may be stationary. The pitch between individual micronozzles 608 in an array of micronozzles 608 may be adjusted to align individual micronozzles 608 over selected microchannels 606. In some embodiments, two-dimensional arrays of stationary micronozzles 608 may comprise multiple stationary micronozzles 608 positioned along microchannels extending in the y-dimension (out of the plane of the figure), for deposition of HTAM structures 607 in segments along microchannels 606.

FIG. 7 illustrates a zoom view 700 of the cold spray process shown in FIG. 6A, depicting details of the cold spray deposition of supplemental material into a microchannel to form a HTAM structure on a customizable template substrate (preform), according to some embodiments of the disclosure.

FIG. 7 shows an enlarged cross-sectional view in the x-z plane of the formation of HTAM structure 607 within microchannel 606 on preform template substrate 603. Particles 701 comprising the supplemental material are entrained in gas jet 602 that is directed over template substrate 603.

Because the gas temperatures are relatively low (e.g., in comparison to a high temperature thermal spray process, where gases may reach temperatures over 3000K, causing particles to melt in flight), particles 701 may be entrained in powder jet 602 in the solid state. Gases may be expanded out of a nozzle (e.g., macronozzle 601 or micronozzles 608) from upstream pressures above 2 MPa (e.g., above 20 atmospheres) to atmospheric pressure, causing entrained particles to reach high velocities (e.g., between 5000 and 10000 m/s). Jet and particle velocities may be adjusted during the process to equal or exceed a critical velocity beyond which particles plastically deform upon impact and adhere to a substrate or to each other in the top layer of the coating formed by build-up of sprayed particles. As the critical velocity depends on the material composing the coating, particles may be driven at velocities ranging between approximately 500 and 1000 m/s. Pressurized gases may be preheated upstream of nozzle 602 to the above-noted temperature range primarily to avoid liquefaction upon expansion.

In some embodiments, free particles 701 are spherical or oval shaped as shown in the expanded view in FIG. 6. While particles 701 are depicted as smooth, spherical particles, they may have any shape, including angular and jagged shapes. Particles 701 may range in diameter between 1 and 50 microns. In some embodiments, particles 701 may comprise a ductile material (e.g., a metal) that may plastically deforms upon impact, forming flattened and elongated lamellae that may have approximate lengths between 100 and 500 microns (shown in FIG. 8). The malleable/ductile material may have a κ>100 W/m-K. In some embodiments, particles 701 may comprise a blend of a brittle material (e.g., diamond) in addition to particles comprising the malleable material. The brittle material may have a of 100 W/m-K or greater. Examples of suitable brittle and ductile materials have been given above.

The energy transfer may cause local heating at the point of impact. A rapid rise in temperature above the melting point of the impacting particle and impact surface may ensue, causing some superficial melting of the particle-surface impact point, enabling particle adhesion by fusion bonding. Continuous particle impact upon the top surface of the growing cold-spray feature may build up matrix 702 as stacks of lamellae 703 formed by the flattened particles adhering to each other (shown in the inset). If a brittle material is included, particles of the brittle material may be embedded within matrix 702. In some embodiments, HTAM structure 607 may have internal voids 705 and embedded intact particles 701. Voids may occur near lamellar boundaries, as shown in greater detail in FIG. 8.

Structures formed by a cold spray process such as process 600 may exhibit a surface roughness of several microns as a result of the coarse granular nature of the cold spray deposition process. An example of surface roughness exhibited by HTAM structure 607 as may be observed microscopically is illustrated in the enlarged cross-sectional view in inset of FIG. 7. Surface 703 of matrix 702 is shown to have a significant average surface roughness relative to adjacent sidewall 704 of template substrate 603. Due to the coarse granular nature of the cold spray deposition process, surface 703 may exhibit an average roughness of 10 microns. Surfaces of template substrate 603, such as sidewall 704 of microchannel 606, may exhibit an average roughness of 1 to 2 microns. In some examples, surfaces of template substrate 603 may exhibit an average roughness of less than one micron. In some embodiments, template substrate 603 itself may be formed by a cold or thermal spray deposition process, and may exhibit a surface roughness similar to that of HTAM structure 607.

Figure 8:
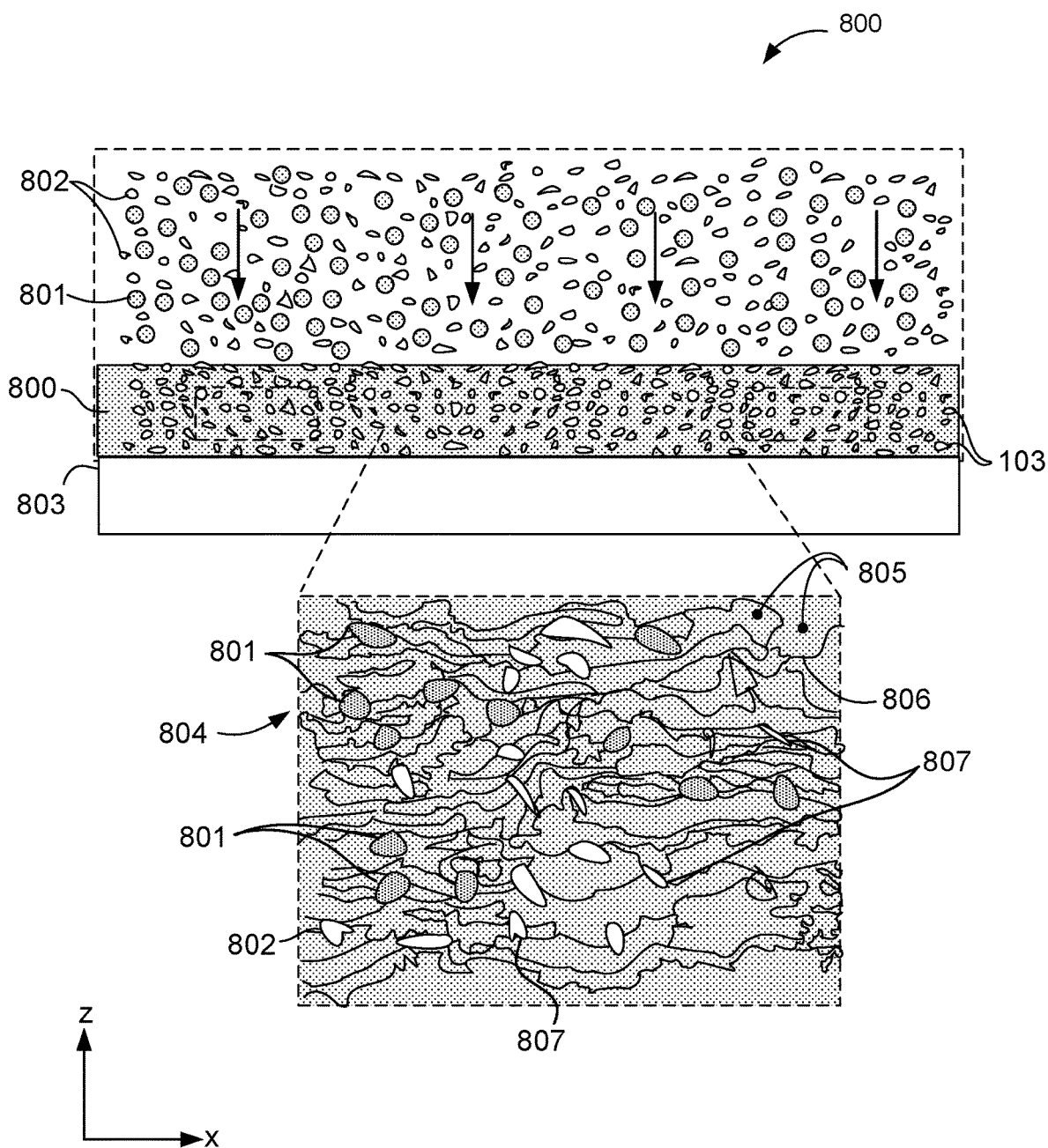
FIG. 8 illustrates a cross-sectional view in the x-z plane of microstructure of the HTAM structure shown in FIG. 7, according to some embodiments of the disclosure.

FIG. 8 illustrates a cross-sectional view in the x-z plane of microstructure of HTAM structure 800, according to some embodiments of the disclosure.

FIG. 8 shows a magnified cross-sectional view of an HTAM structure 800 (e.g., plug 107) in the process of being formed by cold spray deposition of a supplemental material, as has been described above. Within HTAM structure 800, the supplemental material may have a microstructure that is shown in greater detail in the inset of FIG. 8.

In some embodiments, the supplemental material may comprise one or more malleable materials, such as copper. Cold spray deposition of a malleable and/or ductile supplemental material may form a matrix of the malleable material. In other embodiments, the supplemental material may comprise a blend of metal and non-metal materials. Particles of the non-metal, noted here as secondary particles comprising a brittle ceramic material (e.g., diamond or aluminum nitride) or a refractory metal (e.g., tungsten), may be embedded in a matrix (e.g., matrix 702) formed from the malleable and/or ductile metal (e.g., copper or aluminum) particles, noted here as primary particles. Such a material may be formed by cold spray deposition of powder blends comprising primary particles 801 and secondary particles 802. Both primary and secondary particles may have sizes (diameters) ranging from 50 microns to 1000 microns. Both the metallic and non-metallic materials may have high bulk thermal conductivities of 200 W/mK or higher, imparting a high thermal conductivity of 200 W/mK or higher to the bi-component supplemental material.

While in the illustrated embodiment secondary particles 802 are shown to have jagged and angular shapes, secondary particles 802 may be smooth, having near spherical or oval shapes. Sizes of secondary particles 802 may range between 1 and 50 microns. Particles 802 may comprise a brittle material (as described above) that does not plastically deform upon impact, however may fracture. Particles 802 may simply embed between or within lamellae within the matrix.

In the cold spray deposition process, powder particles are entrained in a high-velocity gas jet. While the jet gas may be heated to temperatures up to 800° C., these temperatures are generally too low to melt the particles. Solid high-velocity particles may impinge on a substrate 803 with a great deal of momentum, causing the particles to deform by flattening. Adiabatic heating may occur upon contact, partially melting the outer regions of the impacted particles. The molten surfaces of the particles may allow particles to fuse together, building up solid layers that comprise stacks of flattened particles that resemble lamellae.

Referring to the inset in FIG. 8, a cross-sectional region of HTAM structure 800 is magnified to show microstructure 804. The microstructure may comprise embedded particles 807 and/or voids 808 within a matrix substantially comprising the malleable material. The matrix may have lamellar stacks formed by impact of primary particles, where most of the primary particles plastically deform by elongation and flattening on impact (e.g., splat). Particles may impact each other in succession, forming stacks of contiguous irregular or regular-shaped lamellae 805 throughout the matrix. In some embodiments, individual lamellae 805 are delineated by discernable boundaries 806, which may be observed at magnifications below 500x. In some embodiments, lamellae 805 are not distinguishable at the indicated magnifications.

Lamellae 805 may have irregular shapes, causing voids 808 to appear at lamellar boundaries 806. In some embodiments, intact or mildly deformed primary particles 801 may be embedded within the lamellar matrix. Intact primary particles may displace lamellae in stacks, or embed at lamellar boundaries. In some embodiments, secondary particles 802 may be embedded with the lamellar matrix between lamellae.

Figure 9:
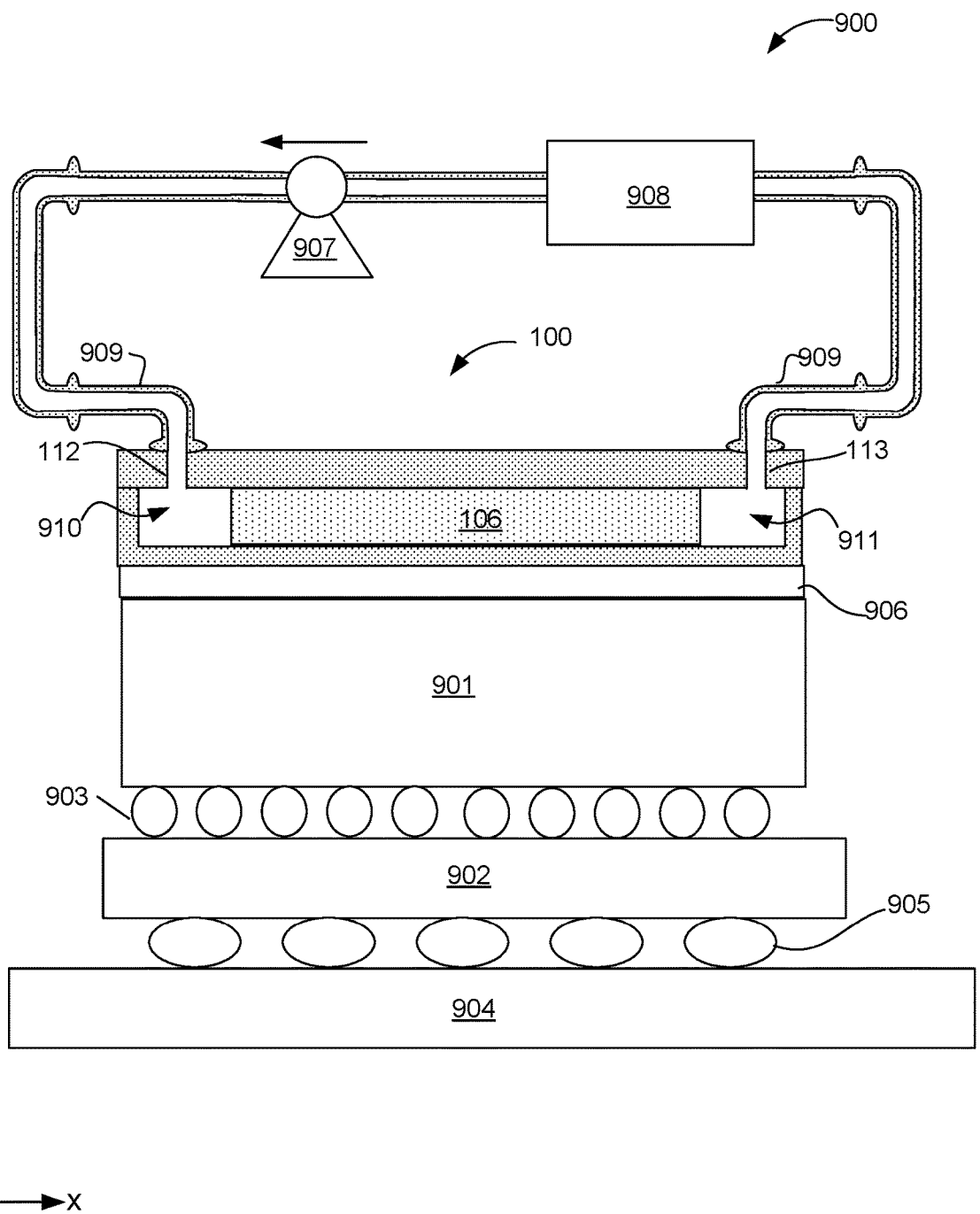
FIG. 9 illustrates a cross sectional view in the x-z plane of an implementation of microfluidic device assembled into an IC package, according to some embodiments of the disclosure.

FIG. 9 illustrates a cross sectional view in the x-z plane of an implementation of microfluidic device 100 assembled into IC package 900, according to some embodiments of the disclosure.

IC package 900 comprises IC chip 901 electrically coupled to package substrate 902 through solder joints 903. IC chip 901 may be a high-performance IC device such as a central processing unit, a graphical processing unit, or a field programmable gate array, for example. Package substrate 902 may be soldered to printed circuit board (PCB) 904 through solder joints 905. PCB 904 may be a computer motherboard. In alternate embodiments, package substrate may be coupled to PCB 904 through a surface mounted socket.

Device 100 is mounted over IC chip 901 and is thermally coupled thereto. A thermal interface material (TIM) 906 may be included between IC chip 901 and device 100 to fill any air gaps that may be present due to non-planarities. TIM 906 may be a thermal grease, paste, or solid pad. Device 100 is coupled to an external coolant circuit through fluid conduit 909. The coolant circuit comprises in-line pump 907 and heat exchanger 908 connected in series by fluid conduit 909. Pump 907 may circulate the coolant within the circuit in the direction of the arrow. Ports 112 and 113 may be an inlet and outlet port, respectively. Coolant (e.g., a liquid) may enter plenum 910, which distributes the coolant to microchannels 102. Coolant may flow within open microchannels (e.g., microchannels without plug 106) to plenum 911, where coolant from all open microchannels is collected. Coolant may exit heat device 100 through outlet port 113 to re-enter fluid conduit 909, where it may be circulated through heat exchanger 908 to dissipate heat and undergo active cooling.

The coolant may be a suitable liquid at room temperature, comprising water, an alcohol, ethylene glycol or a Freon. Alternatively, the coolant may be a gas at room temperature or slightly above room temperature. A suitable gas may be air, nitrogen, helium, argon or ammonia.

Figure 10:
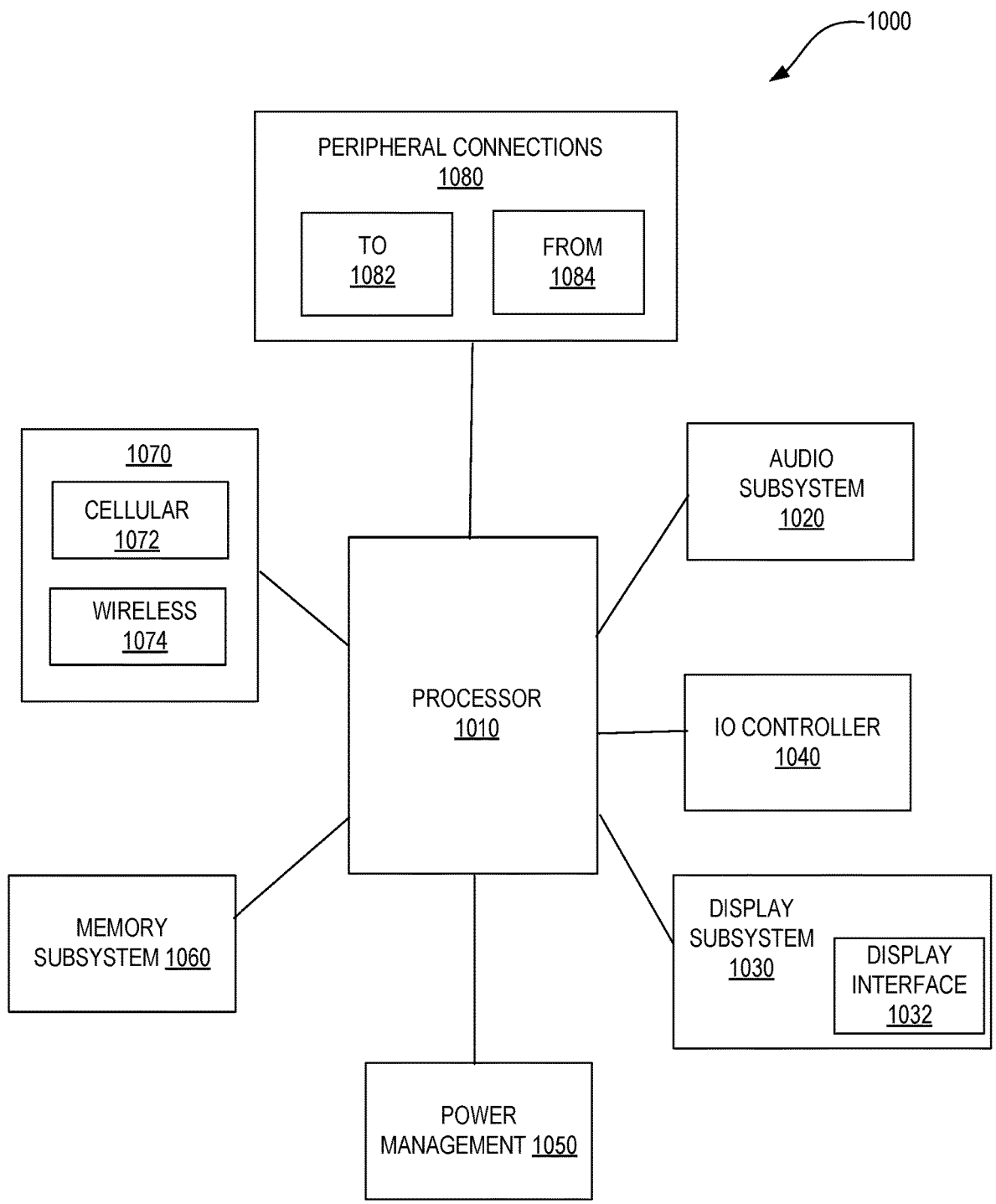
FIG. 10 illustrates a block diagram of computing device 900 as part of a system-on-chip (SoC) package in an implementation of a microfluidic device, according to some embodiments of the disclosure.

FIG. 10 illustrates a block diagram of computing device 1000 as part of a system-on-chip (SoC) package in an implementation of a customizable microfluidic heat spreader, according to some embodiments of the disclosure.

According to some embodiments, computing device 1000 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit) comprises a microfluidic device (e.g., any of customizable microfluidic devices 100, 200, 300 or 400 as disclosed herein).

In some embodiments, computing device has wireless connectivity (e.g., Bluetooth, WiFi and 5G network). It will be understood that certain components are shown generally, and not all components of such a device are shown in computing device 1000.

The various embodiments of the present disclosure may also comprise a network interface within 1070 such as a wireless interface so that a system embodiment may be incorporated into a wireless device, for example, cell phone or personal digital assistant. The wireless interface is a millimeter wave generator and antenna array. The millimeter wave generator may be part of a monolithic microwave integrated circuit.

According to some embodiments, processor 1010 represents a CPU or a GPU, and can include one or more physical devices, such as microprocessors, application processors, microcontrollers, programmable logic devices, or other processing means. Processor 1010 may comprise customizable microfluidic heat spreader (e.g., customizable microfluidic heat spreader 100, 200, 300 or 400) as disclosed. The processing operations performed by processor 1010 include the execution of an operating platform or operating system on which applications and/or device functions are executed. The processing operations include operations related to I/O (input/output) with a human user or with other devices, operations related to power management, and/or operations related to connecting the computing device 1000 to another device. The processing operations may also include operations related to audio I/O and/or display I/O.

In one embodiment, computing device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1000, or connected to the computing device 1000. In one embodiment, a user interacts with the computing device 1000 by providing audio commands that are received and processed by processor 1010

Display subsystem 1030 represents hardware (e.g., display devices) and software (e.g., drivers) components that provide a visual and/or tactile display for a user to interact with the computing device 1000. Display subsystem 1030 includes display interface 1032 which includes the particular screen or hardware device used to provide a display to a user. In one embodiment, display interface 1032 includes logic separate from processor 1010 to perform at least some processing related to the display. In one embodiment, display subsystem 1030 includes a touch screen (or touch pad) device that provides both output and input to a user.

I/O controller 1040 represents hardware devices and software components related to interaction with a user. I/O controller 1040 is operable to manage hardware that is part of audio subsystem 1020 and/or display subsystem 1030. Additionally, I/O controller 1040 illustrates a connection point for additional devices that connect to computing device 1000 through which a user might interact with the system. For example, devices that can be attached to the computing device 1000 might include microphone devices, speaker or stereo systems, video systems or other display devices, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of the computing device 1000. Additionally, audio output can be provided instead of, or in addition to display output. In another example, if display subsystem 1030 includes a touch screen, the display device also acts as an input device, which can be at least partially managed by I/O controller 1040. There can also be additional buttons or switches on the computing device 1000 to provide I/O functions managed by I/O controller 1040.

In one embodiment, I/O controller 1040 manages devices such as accelerometers, cameras, light sensors or other environmental sensors, or other hardware that can be included in the computing device 1000. The input can be part of direct user interaction, as well as providing environmental input to the system to influence its operations (such as filtering for noise, adjusting displays for brightness detection, applying a flash for a camera, or other features).

In one embodiment, computing device 1000 includes power management 1050 that manages battery power usage, charging of the battery, and features related to power saving operation. Memory subsystem 1060 includes memory devices for storing information in computing device 1000. Memory can include nonvolatile (state does not change if power to the memory device is interrupted) and/or volatile (state is indeterminate if power to the memory device is interrupted) memory devices. Memory subsystem 1060 can store application data, user data, music, photos, documents, or other data, as well as system data (whether long-term or temporary) related to the execution of the applications and functions of the computing device 1000.

Elements of embodiments are also provided as a machine-readable medium (e.g., memory 1060) for storing the computer-executable instructions. The machine-readable medium (e.g., memory 1060) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1070 includes hardware devices (e.g., wireless and/or wired connectors and communication hardware) and software components (e.g., drivers, protocol stacks) to enable the computing device 1000 to communicate with external devices. The computing device 1000 could be separate devices, such as other computing devices, wireless access points or base stations, as well as peripherals such as headsets, printers, or other devices.

Network interface 1070 can include multiple different types of connectivity. To generalize, the computing device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1074 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1080 include hardware interfaces and connectors, as well as software components (e.g., drivers, protocol stacks) to make peripheral connections. It will be understood that the computing device 1000 could both be a peripheral device ("to" 1082) to other computing devices, as well as have peripheral devices ("from" 1084) connected to it. The computing device 1000 commonly has a "docking" connector to connect to other computing devices for purposes such as managing (e.g., downloading and/or uploading, changing, synchronizing) content on computing device 1000. Additionally, a docking connector can allow computing device 1000 to connect to certain peripherals that allow the computing device 1000 to control content output, for example, to audiovisual or other systems.

In addition to a proprietary docking connector or other proprietary connection hardware, the computing device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is a microfluidic device, comprising a channel within a first material to thermally couple with an IC die, wherein the channel defines an initial fluid path between a fluid inlet port and a fluid outlet port, and a second material within a portion of the channel, wherein the second material supplements the first material to modify the initial fluid path into a final fluid path between the fluid inlet port and the fluid outlet port, wherein the second material has a different composition or microstructure than the first material.

Example 2 includes all of the features of example 1, wherein the channel is one of a plurality of channels coupled in parallel between the fluid inlet port and to the fluid outlet port, wherein the first material is between lengths of adjacent ones of the channels, and wherein the second material at least partially restricts one or more of the plurality of channels.

Example 3 includes all of the features of example 2, wherein at least a portion of the second material defines a baffle within the channel, the baffle having a cross-sectional area less than that of the channel.

Example 4 includes all of the features of example 2, wherein at least a portion of the second material substantially occludes one or more of the plurality of channels, the second material substantially filling a continuous length of the channel from a first point proximal the fluid outlet port to a second point proximal the fluid inlet port, and wherein the channel is substantially unrestricted by the second material between the second point and the fluid inlet port.

Example 5 includes all of the features of any one of examples 1 to 4, further comprising a plurality of baffles within the channel, wherein the baffles comprise the first material, and wherein the second material unites two or more of the baffles.

Example 6 includes all of the features of example 5, wherein the plurality of baffles are spaced apart on a rectangular grid, and wherein the two or more of the baffles are within a single row or a single column of the rectangular grid.

Example 7 includes all of the features of example 6, wherein the second material unifies all baffles within a row of the rectangular grid along a length between the fluid inlet port and the fluid outlet port.

Example 8 includes all of the features of example 7, wherein the second material further unifies the row with one or more baffles of an adjacent row in the rectangular grid.

Example 9 includes all of the features of any one of examples 1 to 8, further comprising a lid affixed to at least the first material, the lid enclosing the channel.

Example 10 includes all of the features of any one of examples 1 to 9, wherein the initial route is independent of circuitry layout in the IC die, and wherein the final route is based on the circuitry layout of the IC die.

Example 11 includes all of the features of any one of examples 1 to 10, wherein, relative to a first of the first or second materials, a second of the first or second materials has a least one of, a greater surface roughness, or a greater % voiding area.

Example 12 includes all of the features of example 11, wherein the first material has substantially zero % voiding area, and the second material has a non-zero % voiding area less than 0.5%.

Example 13 includes all of the features of any one of examples 1 to 12, wherein at least one of the first and second materials comprises at least one of: copper, silver, gold, aluminum, nickel, boron, carbon, aluminum, silicon or nitrogen.

Example 14 includes all of the features of example 13, wherein a first of the first and second materials comprises at least a first of copper, silver, gold, aluminum, nickel, boron, carbon, aluminum, silicon or nitrogen, and wherein a second of the first and second materials comprises at least a second of copper, silver, gold, aluminum, nickel, boron, carbon, aluminum, silicon or nitrogen.

Example 15 is an electronic device comprising an IC die and a microfluidic device thermally coupled to the IC die through a thermal interface material therebetween, wherein the microfluidic device comprises a channel within a first material to thermally couple with an IC die, the channel defining an initial fluid path between a fluid inlet port and fluid outlet port, and a second material within a portion of the channel, the second material supplementing the first material to modify the initial fluid path into a final fluid path between the fluid inlet port and the fluid outlet port, wherein the second material has a different composition or microstructures than the first material.

Example 16 includes all of the features of example 15, further comprising a first fluid conduit coupled to the fluid inlet port, a second fluid conduit coupled to the second flow port, a fluid reservoir coupled to the first and second fluid conduit; and a pump coupled to at least one of the first or second fluid conduits.

Example 17 is a method of fabricating a microfluidic device, the method comprising receiving a preform comprising a first material with a channel therein, the channel defining an initial fluid path between a fluid inlet port and a fluid outlet port, and modifying the initial fluid path into a final fluid path by spray depositing a second material within the channel.

Example 18 includes all of the features of example 17, further comprising applying a lid over the preform to enclose the final fluid path.

Example 19 includes all of the features of examples 17 or 18, wherein spray depositing the second material further comprises defining a baffle within the channel by spray depositing the second material to a thickness less than a depth of the channel or to lateral width less than a lateral width of the channel.

Example 20 includes all of the features of any one of examples 17 through 19, wherein the preform further comprises a plurality of baffles within the channel, wherein the baffles comprise the first material, and wherein spray depositing the second material further comprises at least partially backfilling a portion of the baffles with the second material.

Example 21 includes all of the features of example 20, wherein the baffles are spaced apart on a rectangular grid, and wherein spray depositing the second material further comprises at least partially backfilling two or more adjacent rows of the baffles.

An abstract is submitted with the understanding that it will not be used to limit the scope or meaning of the claims. The following claims are hereby incorporated into the detailed description, with each claim standing on its own as a separate embodiment.

We claim:

1. A microfluidic device, comprising:
a channel of a width defined within a first material body to thermally couple with an IC die, wherein the channel defines a portion of an initial fluid path external of the first material body that extends between a fluid inlet port and a fluid outlet port, and wherein the channel is one of a plurality of continuous channels external of the first material body that are coupled in parallel between the fluid inlet port and to the fluid outlet port; and
a second material body within a length of the channel, wherein the second material body completely occludes fluid flow through an entirety of the width to alter the initial fluid path into a final fluid path consisting of a restricted portion of the channels external of the second material body, and wherein the second material body has a different composition or microstructure than the first material.

2. The microfluidic device of claim 1, wherein the first material body is between lengths of adjacent ones of the channels, and wherein the second material body completely occludes the channel and confines the final fluid path to remaining ones of the plurality of channels.

3. The microfluidic device of claim 2, wherein at least a portion of the second material body defines a baffle within the channel, the baffle having a cross-sectional area less than that of the channel.

4. The microfluidic device of claim 2, wherein the second material body substantially fills a continuous length of the channel from a first point proximal the fluid outlet port to a second point proximal the fluid inlet port, and wherein the channel is substantially unrestricted by the second material body between the second point and the fluid inlet port.

5. The microfluidic device of claim 1, wherein the first material body comprises a plurality of pillars, and wherein the second material unites two or more of the pillars.

6. The microfluidic device of claim 5, wherein the plurality of pillars are spaced apart on a rectangular grid, and wherein the two or more of the pillars are within a single row or a single column of the rectangular grid.

7. The microfluidic device of claim 6, wherein the second material body unifies all of the pillars within a row of the rectangular grid along a length between the fluid inlet port and the fluid outlet port.

8. The microfluidic device of claim 7, wherein the second material body further unifies the row with one or more pillars of an adjacent row in the rectangular grid.

9. The microfluidic device of claim 1, further comprising a lid affixed to at least the first material body, the lid enclosing the channel.

10. The microfluidic device of claim 1, wherein the initial fluid path is independent of circuitry layout in the IC die, and wherein the final fluid path is based on the circuitry layout of the IC die.

11. The microfluidic device of claim 1, wherein
the second material body has at least one of, a greater surface roughness, or a greater % voiding area than the first material body.

12. The microfluidic device of claim 11, wherein the first material body has substantially zero % voiding area, and the second material body has a non-zero % voiding area less than 0.5%.

13. The microfluidic device of claim 11, wherein at least one of the first and second bodies comprises at least one of: copper, silver, gold, aluminum, nickel, boron, carbon, silicon or nitrogen.

14. The microfluidic device of claim 13, wherein a first of the first and second material bodies comprises at least a first of copper, silver, gold, aluminum, nickel, boron, carbon, silicon or nitrogen, and wherein a second of the first and second bodies comprises at least a second of copper, silver, gold, aluminum, nickel, boron, carbon, silicon or nitrogen.

15. An electronic device, comprising:
an IC die; and
the microfluidic device of claim 1 thermally coupled to the IC die.

16. The electronic device of claim 15, further comprising:
a first fluid conduit coupled to the fluid inlet port;
a second fluid conduit coupled to the fluid outlet port;
a fluid reservoir coupled to the first and second fluid conduits; and
a pump coupled to at least one of the first or second fluid conduits.

17. The electronic device of claim 15, wherein the first material body has substantially zero % voiding area, and the second material body has a non-zero % voiding area less than 0.5%.

18. The microfluidic device of claim 15, wherein at least one of the first and second material bodies comprises at least one of: copper, silver, gold, aluminum, nickel, boron, carbon, silicon or nitrogen.

19. The microfluidic device of claim 18, wherein a first of the first and second bodies comprises at least a first of copper, silver, gold, aluminum, nickel, boron, carbon, silicon or nitrogen, and wherein a second of the first and second bodies comprises at least a second of copper, silver, gold, aluminum, nickel, boron, carbon, silicon or nitrogen.

* * * * *